(12) United States Patent
Umezawa

(10) Patent No.: US 11,069,654 B2
(45) Date of Patent: Jul. 20, 2021

(54) METAL FRAME, DUMMY WAFER, SEMICONDUCTOR DEVICE, ELECTRONIC DEVICE, AND METHOD OF MANUFACTURING SEMICONDUCTOR DEVICE

(71) Applicant: SONY CORPORATION, Tokyo (JP)

(72) Inventor: Jo Umezawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 284 days.

(21) Appl. No.: 16/301,287

(22) PCT Filed: May 10, 2017

(86) PCT No.: PCT/JP2017/017724
§ 371 (c)(1),
(2) Date: Nov. 13, 2018

(87) PCT Pub. No.: WO2017/208756
PCT Pub. Date: Dec. 7, 2017

(65) Prior Publication Data
US 2020/0321312 A1   Oct. 8, 2020

(30) Foreign Application Priority Data
Jun. 1, 2016 (JP) .............................. JP2016-110267

(51) Int. Cl.
*H01L 21/56* (2006.01)
*H01L 23/00* (2006.01)
(Continued)

(52) U.S. Cl.
CPC .......... *H01L 24/96* (2013.01); *H01L 21/4853* (2013.01); *H01L 21/561* (2013.01);
(Continued)

(58) Field of Classification Search
CPC ..... H01L 24/96; H01L 21/561; H01L 21/565; H01L 21/568; H01L 21/6836;
(Continued)

(56) References Cited

U.S. PATENT DOCUMENTS 7,737,707 B2 * 6/2010 Sato .................... A63H 29/22
324/754.03
8,042,248 B2 * 10/2011 Shih .................... C03C 17/22
29/414
(Continued)

FOREIGN PATENT DOCUMENTS

DE     60109983 T2    2/2006
EP      1150552 A2   10/2001
(Continued)

OTHER PUBLICATIONS

International Search Report and Written Opinion of PCT Application No. PCT/JP2017/017724, dated Jul. 25, 2017, 09 pages of ISRWO.

*Primary Examiner* — Vu A Vu
(74) *Attorney, Agent, or Firm* — Chip Law Group

(57) ABSTRACT

A metal frame that is used in a dummy wafer in which chip-like semiconductor elements and a rewiring layer are integrated. A plurality of openings in which the chip-like semiconductor elements are disposed are formed in the metal plate, and a lattice structure is formed with the frames that are the portions between adjacent openings of the plurality of openings. Of the frames forming the lattice structure, the frames located in dicing areas of the dummy wafer are arranged in a discontinuous manner.

18 Claims, 28 Drawing Sheets

(51) Int. Cl.
  *H01L 21/48* (2006.01)
  *H01L 21/683* (2006.01)
  *H01L 21/78* (2006.01)
  *H01L 23/31* (2006.01)
  *H01L 23/538* (2006.01)

(52) U.S. Cl.
  CPC .......... *H01L 21/565* (2013.01); *H01L 21/568* (2013.01); *H01L 21/6836* (2013.01); *H01L 21/78* (2013.01); *H01L 23/3128* (2013.01); *H01L 23/5386* (2013.01); *H01L 23/5389* (2013.01); *H01L 23/562* (2013.01); *H01L 24/19* (2013.01); *H01L 24/20* (2013.01); *H01L 2221/68327* (2013.01); *H01L 2224/214* (2013.01); *H01L 2224/95001* (2013.01); *H01L 2924/3511* (2013.01)

(58) Field of Classification Search
  CPC ......... H01L 21/78; H01L 24/19; H01L 24/20; H01L 23/3128; H01L 23/5386; H01L 23/5389; H01L 23/562; H01L 21/4853; H01L 2924/3511; H01L 2221/68327; H01L 2224/214; H01L 2224/95001
  USPC ........................................................ 257/668
  See application file for complete search history.

(56) References Cited

U.S. PATENT DOCUMENTS

| | | |
|---|---|---|
| 2002/0011655 A1 | 1/2002 | Nishiyama et al. |
| 2003/0016511 A1 | 1/2003 | Tomita et al. |
| 2009/0203171 A1* | 8/2009 | Takemasa ............... H01L 24/97 438/113 |

FOREIGN PATENT DOCUMENTS

| | | |
|---|---|---|
| JP | 2001-127088 A | 5/2001 |
| JP | 2001-308116 A | 11/2001 |
| JP | 2011-181740 A | 9/2011 |
| JP | 2015-076604 A | 4/2015 |
| KR | 10-2015-0042043 A | 4/2015 |
| TW | 239056 B | 9/2005 |

* cited by examiner

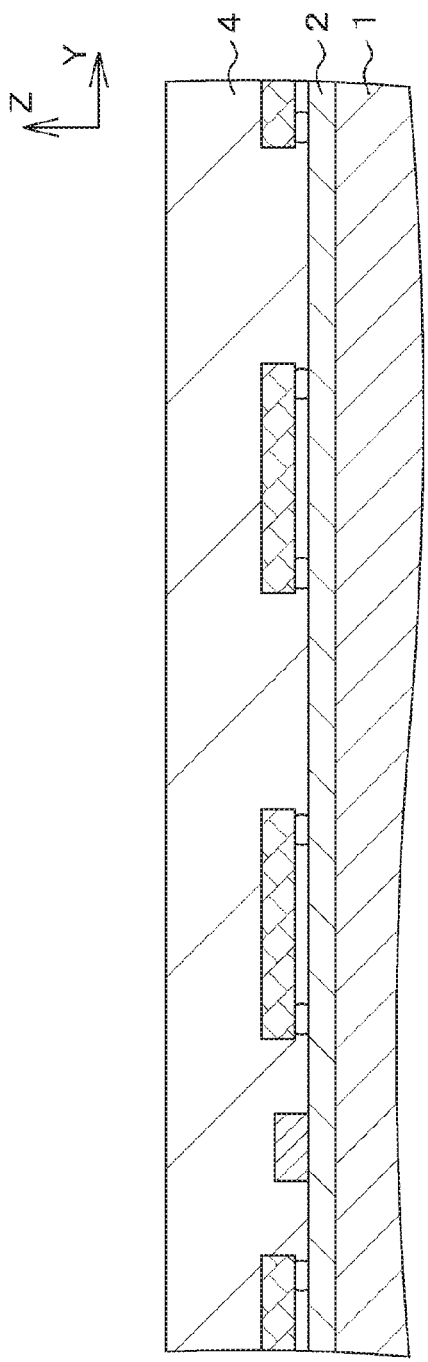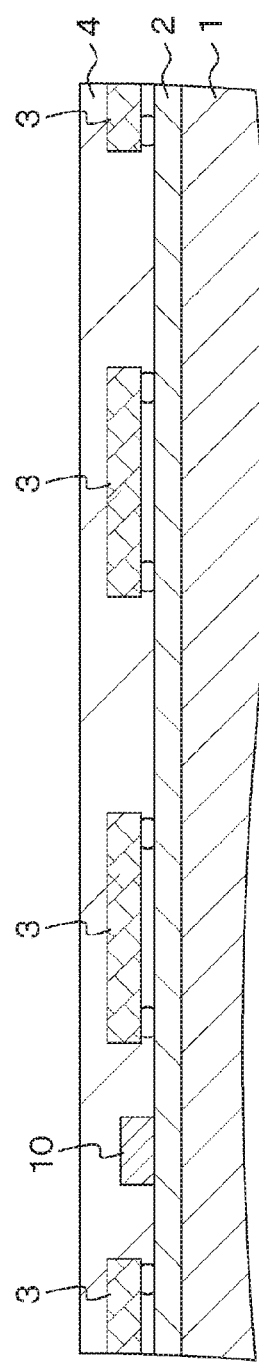

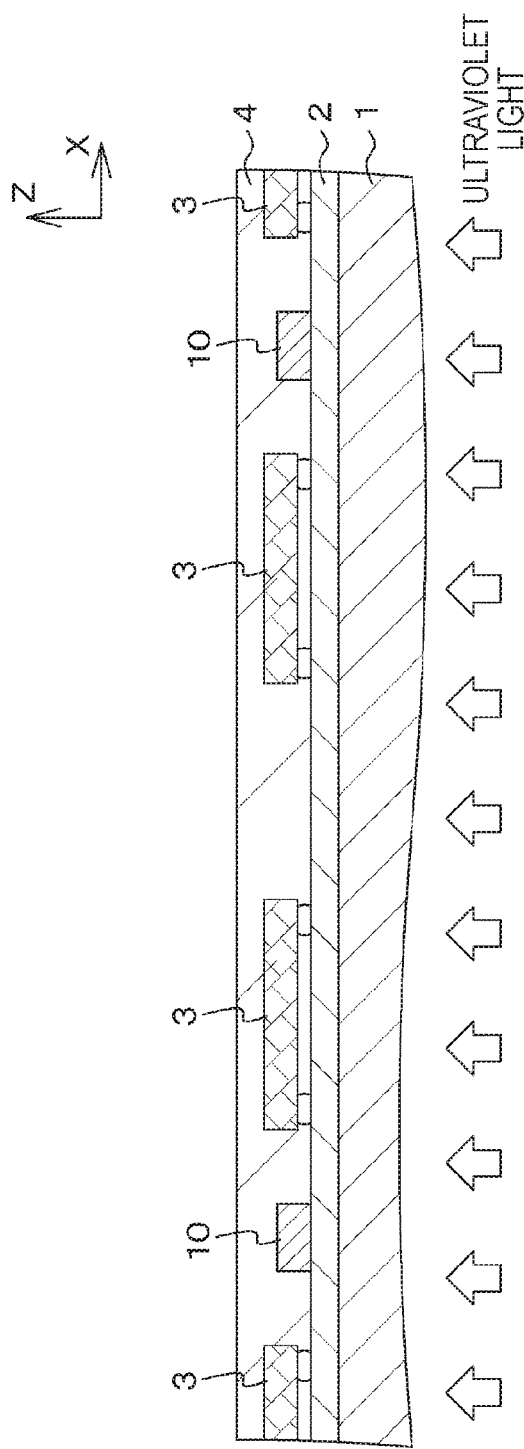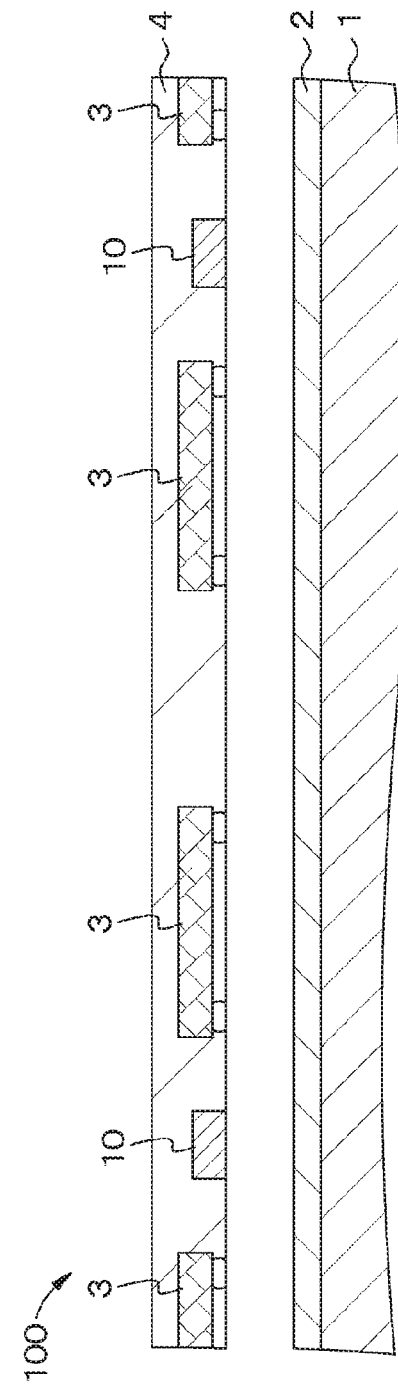

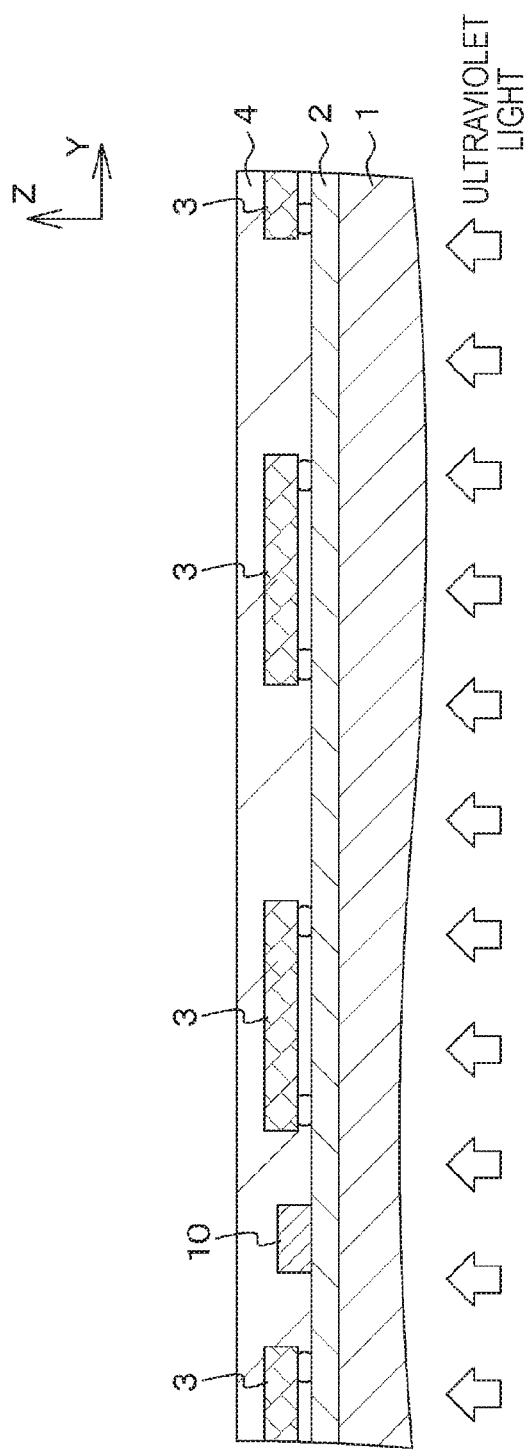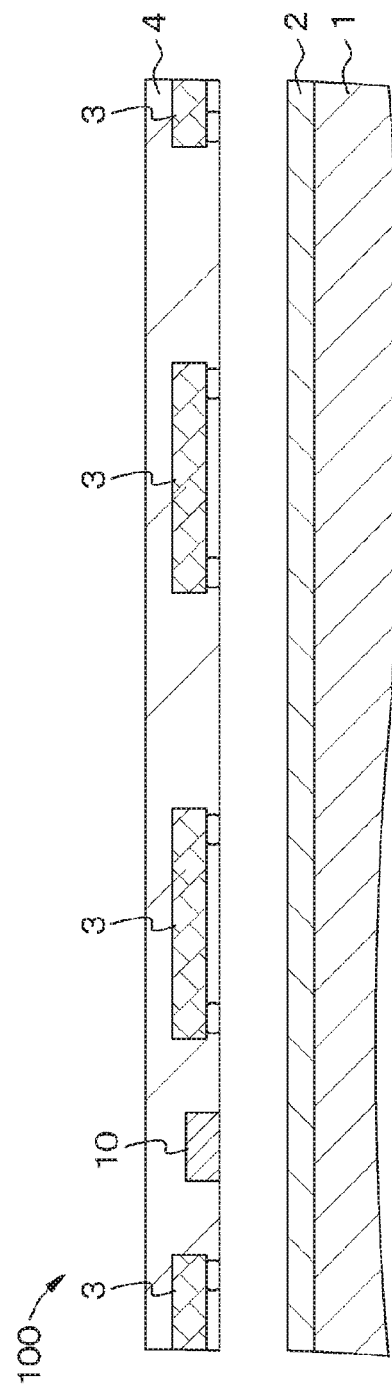

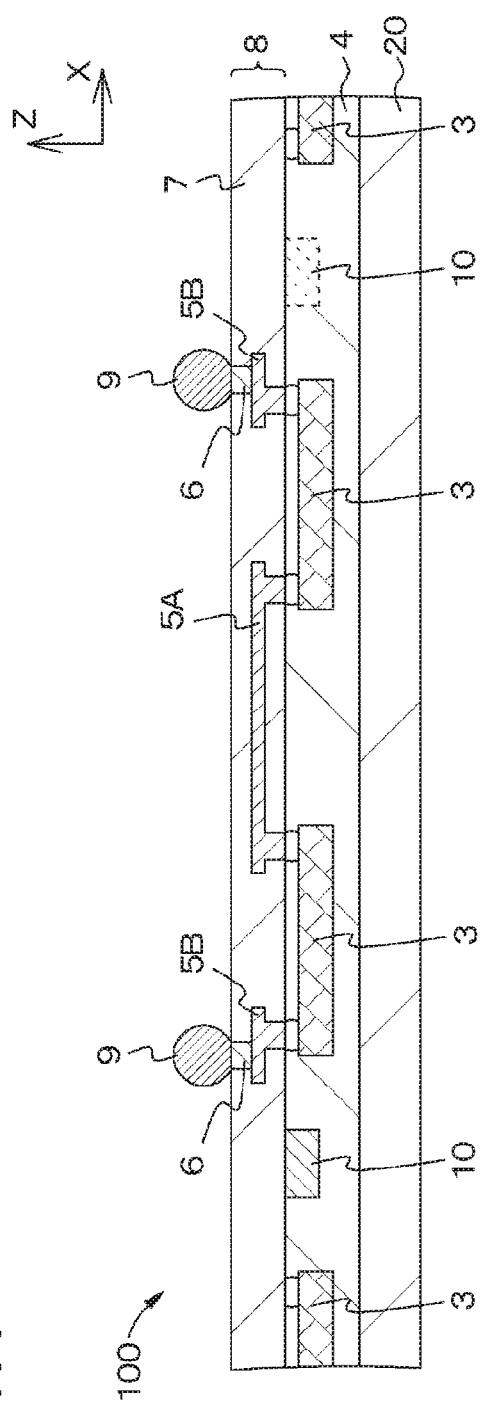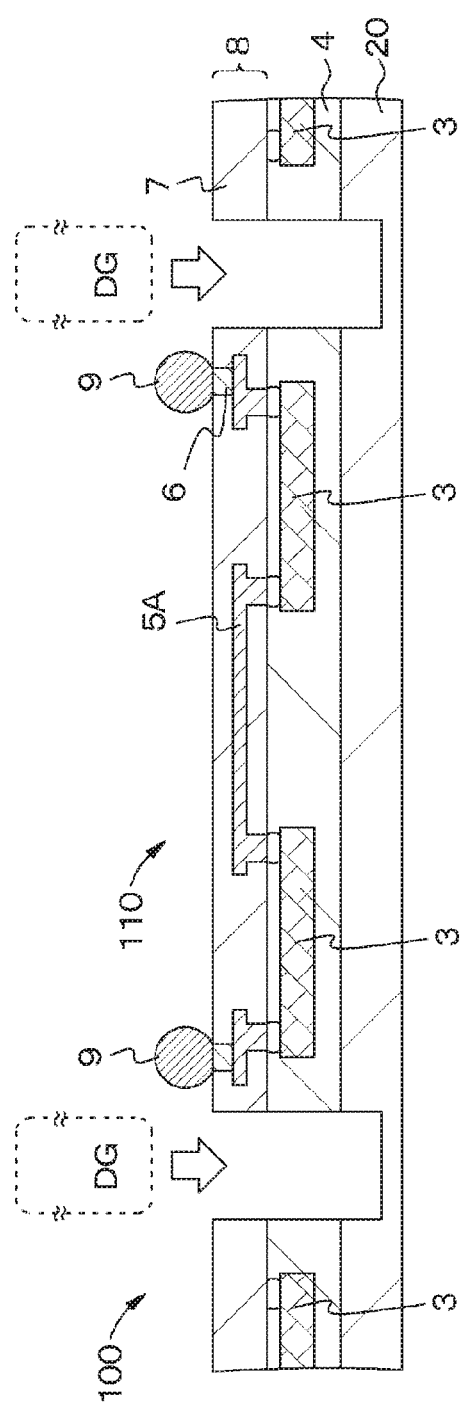

METAL FRAME, DUMMY WAFER, SEMICONDUCTOR DEVICE, ELECTRONIC DEVICE, AND METHOD OF MANUFACTURING SEMICONDUCTOR DEVICE

CROSS REFERENCE TO RELATED APPLICATIONS

This application is a U.S. National Phase of International Patent Application No. PCT/JP2017/017724 filed on May 10, 2017, which claims priority benefit of Japanese Patent Application No. JP 2016-110267 filed in the Japan Patent Office on Jun. 1, 2016. Each of the above-referenced applications is hereby incorporated herein by reference in its entirety.

TECHNICAL FIELD

The present disclosure relates to a metal frame, a dummy wafer, a semiconductor device, an electronic device, and a method of manufacturing a semiconductor device.

BACKGROUND ART

As electronic devices have been becoming smaller and thinner, the packages containing chip-like semiconductor elements are also expected to be smaller and thinner, and to have a multiterminal structure. Because of this, there is a suggested method of manufacturing a semiconductor device called a fan-out wafer level package (FO-WLP) in which terminals are rearranged outside the component area.

By this method of manufacturing a semiconductor device, a plurality of chip-like semiconductor elements arranged on an adhesive layer are collectively sealed with a resin material, to form a dummy wafer in which the plurality of chip-like semiconductor elements are sealed with a sealing layer. After that, the dummy wafer is detached from the adhesive layer, and a rewiring layer is then formed collectively on the exposed surfaces of the chip-like semiconductor elements by a wafer process (see FIG. 1 of Patent Document 1, for example).

CITATION LIST

Patent Document

Patent Document 1: Japanese Patent Application Laid-Open No. 2001-308116

SUMMARY OF THE INVENTION

Problems to be Solved by the Invention

In the sealing layer forming the dummy wafer, stress is generated by contraction during the curing, for example. This becomes the cause of warpage of the dummy wafer, and hinders increase in size. Further, to reduce the thickness of the package, it is necessary to reduce the thickness of the sealing layer forming the dummy wafer. However, if the sealing layer is made thinner, the rigidity of the entire dummy wafer becomes lower, and might lead to a problem such as deformation or cracking of the entire or part of the dummy wafer due to external stress such as the heat applied during the rewiring line formation process.

To avoid warpage and deformation of the dummy wafer, a high-rigidity structure such as a lattice-like metal frame may be buried in the dummy wafer. In this manner, rigidity is increased, and warpage is prevented. However, a metal has high ductility, and differs from resin in machinability. Therefore, during the dicing of the dummy wafer, abrasion of the dicing blade, heat generation, or the like might be caused, resulting in decrease in yield.

In view of the above, the present invention aims to provide a metal frame capable of reducing abrasion of a dicing blade, heat generation, and the like, a dummy wafer including the metal frame, a semiconductor device obtained by dicing the dummy wafer into pieces, an electronic device including the semiconductor device, and further, a method of manufacturing a semiconductor device.

Solutions to Problems

A metal frame according to a first mode of the present invention to achieve the above objective is a metal frame that is used in a dummy wafer in which chip-like semiconductor elements and a rewiring layer are integrated, a plurality of openings in which the chip-like semiconductor elements are disposed being formed, a lattice structure being formed with frames, the frames being portions between adjacent openings of the plurality of openings, of the frames forming the lattice structure, frames located in a dicing area of the dummy wafer being arranged in a discontinuous manner.

A dummy wafer according to the first mode of the present invention to achieve the above objective is a dummy wafer in which chip-like semiconductor elements and a rewiring layer are integrated, the dummy wafer including a metal frame having a plurality of openings in which the chip-like semiconductor elements are disposed, a lattice structure being formed with frames, the frames being portions between adjacent openings of the plurality of openings, in which, of the frames forming the lattice structure, frames located in a dicing area of the dummy wafer are arranged in a discontinuous manner.

A semiconductor device according to the first mode of the present invention to achieve the above objective is a semiconductor device formed by dividing a dummy wafer into pieces through dicing, chip-like semiconductor elements and a rewiring layer being integrated in the dummy wafer, the semiconductor device including a metal frame having a plurality of openings in which the chip-like semiconductor elements are disposed, a lattice structure being formed with frames, the frames being portions between adjacent openings of the plurality of openings, in which, of the frames forming the lattice structure, frames located in a dicing area of the dummy wafer are arranged in a discontinuous manner.

An electronic device according to the first mode of the present invention to achieve the above objective is an electronic device including a semiconductor device, the electronic device including a semiconductor device formed by dividing a dummy wafer into pieces through dicing, chip-like semiconductor elements and a rewiring layer being integrated in the dummy wafer, the dummy wafer including a metal frame having a plurality of openings in which the chip-like semiconductor elements are disposed, a lattice structure being formed with frames, the frames being portions between adjacent openings of the plurality of openings, of the frames forming the lattice structure, frames located in a dicing area of the dummy wafer being arranged in a discontinuous manner.

A method of manufacturing a semiconductor device according to the first mode of the present invention to achieve the above objective is a method of manufacturing a semiconductor device, including the step of completing a dummy wafer in which chip-like semiconductor elements and a rewiring layer are integrated,
the step of completing the dummy wafer including:
disposing a metal frame and the chip-like semiconductor elements on a support, the metal frame having a lattice structure formed with frames, a plurality of openings being formed in the metal frame, the frames being portions between adjacent openings of the plurality of openings, the chip-like semiconductor elements being disposed in the openings;
forming a sealing layer on the entire surface of the support, including the metal frame and the chip-like semiconductor elements;
detaching the sealing layer in which the metal frame and the chip-like semiconductor elements are sealed from the support; and
forming the rewiring layer on the release surface side of the sealing layer.

A method of manufacturing a semiconductor device according to a second mode of the present invention to achieve the above objective is a method of manufacturing a semiconductor device, including the step of completing a dummy wafer in which chip-like semiconductor elements and a rewiring layer are integrated,
the step of completing the dummy wafer including:
forming the rewiring layer on a support;
forming a metal frame on the rewiring layer, the metal frame having a lattice structure formed with frames, a plurality of openings being formed in the metal frame, the frames being portions between adjacent openings of the plurality of openings, the chip-like semiconductor elements being disposed in the openings;
disposing the chip-like semiconductor elements on the rewiring layer at the portions of the openings in the metal frame;
forming a sealing layer on the entire surface of the rewiring layer, including the metal frame and the chip-like semiconductor elements; and
detaching the rewiring layer from the support.

Effects of the Invention

In a metal frame of the present disclosure, the frames disposed in the dicing areas of the dummy wafer are arranged in a discontinuous manner. Because of this, the frames in the metal frame are not to be continuously cut over during the dicing, and accordingly, abrasion of the dicing blade, heat generation, and the like are reduced. In a dummy wafer using the metal frame of the present disclosure, rigidity can be increased, and further, decrease in yield in the dicing can be reduced.

BRIEF DESCRIPTION OF DRAWINGS

FIGS. 10A and 10B are diagrams corresponding to FIGS. 9A and 9B, and are schematic partial cross-sectional diagrams of a portion cut long a different cutting plane.
FIGS. 11A and 11B are schematic partial cross-sectional diagrams for explaining steps of manufacturing a semiconductor device, continued from FIG. 9B.
FIGS. 12A and 12B are diagrams corresponding to FIGS. 11A and 11B, and are schematic partial cross-sectional diagrams of a portion cut long a different cutting plane.
FIGS. 17A and 17B are schematic partial cross-sectional diagrams for explaining steps of manufacturing a semiconductor device, continued from FIG. 14B.

MODES FOR CARRYING OUT THE INVENTION

Figure 1:
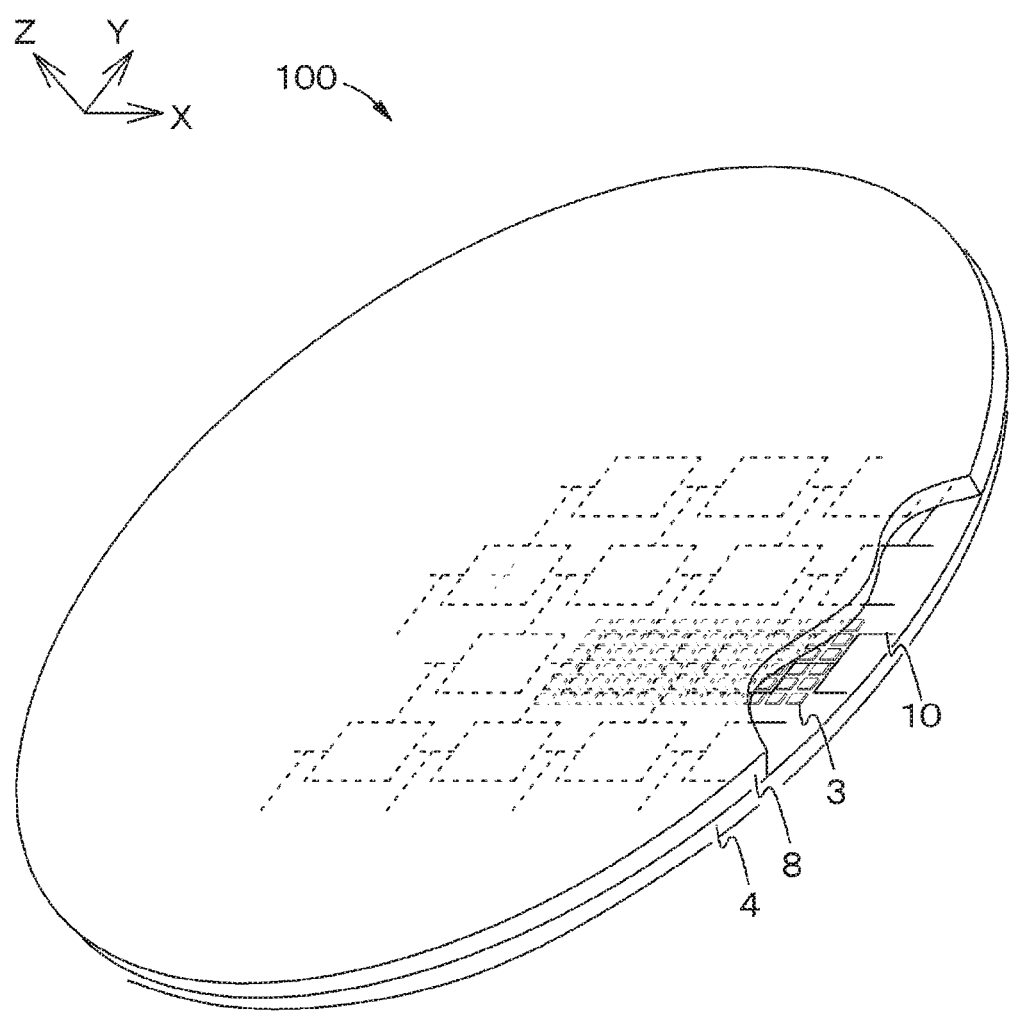
FIG. 1 is a schematic perspective view of a dummy wafer according to a first embodiment.

The following is a description of the present disclosure on the basis of embodiments, with reference to the drawings. The present disclosure is not limited to the embodiments, and various numerical values and materials used in the embodiments are examples. In the description below, like components or components having like functions are denoted by like reference numerals, and explanation of them will not be made more than once. Note that explanation will be made in the following order.

1. Explanation regarding a metal frame, a dummy wafer, a semiconductor device, an electronic device, a method of manufacturing the semiconductor device, and general matters according to the present disclosure
2. First Embodiment
3. Second Embodiment
4. Third Embodiment
5. Fourth Embodiment
6. Other aspects

[Explanation Regarding a Metal Frame, a Dummy Wafer, a Semiconductor Device, an Electronic Device, a Method of Manufacturing the Semiconductor Device, and General Aspects According to the Present Disclosure]

In a metal frame according to the present disclosure, a dummy wafer according to the present disclosure, a semiconductor device, an electronic device, and a metal frame to be used in a method of manufacturing a semiconductor device (hereinafter, these components will be simply referred to as a metal frame of the present disclosure in some cases), the frames disposed in the dicing areas of a dummy wafer among the frames constituting a lattice structure can be arranged in a discontinuous manner.

In this case, a metal frame may be designed to have openings of such a shape that is filled with one or a plurality of singulated regions of a dummy wafer. In this case, all the frames of the metal frame are cut away by dicing, and therefore, the frames of the metal frame do not remain in the semiconductor devices obtained through singulation.

Alternatively, a metal frame may be designed to have openings of such a shape that is not filled with one or a plurality of singulated regions of a dummy wafer. In this case, the frames of the metal frame remain in some or all of the semiconductor devices obtained through singulation.

The frame portions can also be used as power supply lines, ground lines, or the like for the semiconductor devices, for example.

In this case, the metal frame may include frames that are provided at positions deviating from dicing areas and extend longitudinally in singulated regions.

A metal frame of the present disclosure including the above mentioned various preferred components preferably includes a ductile material. It is basically possible to use a material similar to that of the lead frames. Specifically, the material forming the metal frame is preferably copper, a copper alloy, or an iron alloy. Examples of copper alloys include Cu—Fe alloys, Cu—Zn alloys, Cu—Ni alloys, and Cu—Sn alloys. Examples of iron alloys include Fe—Cu alloys and Fe—Ni alloys.

The metal frame of the present disclosure including the above mentioned various preferred components may be formed with a material that includes a metal and is subjected to punching by a pressing method or an etching method, or may be formed with a metal material layer formed on the portions corresponding to the frames by a plating process. In this case, processing is preferably performed beforehand so as to match the planar shape of the dummy wafer.

By the above method of manufacturing a semiconductor device according to a first mode of the present disclosure, the frames located in the dicing areas of a dummy wafer among the frames constituting a lattice structure are arranged in a discontinuous manner, and it is possible to obtain a semiconductor device including chip-like semiconductor elements and a rewiring layer, by dividing the dummy wafer into pieces through dicing.

In this case, a metal frame that is prepared in advance can be placed on a support. The metal frame may be formed with a material that includes a metal and is subjected to punching by a pressing method or an etching method, for example.

Alternatively, a metal material layer may be formed on a predetermined region of the support, so that a metal frame formed with the metal material layer can be provided on the support. In this case, a metal material layer can be formed by a plating process in this step. For example, a mask corresponding to the openings in the metal frame is prepared, and lift-off or the like is performed after a plating process. In this manner, a metal material layer can be formed on a predetermined region of the support. This configuration has the advantage that metal frame miniaturization and high alignment accuracy can be achieved.

By the above method of manufacturing a semiconductor device according to a second mode of the present disclosure, the frames located in the dicing areas of a dummy wafer among the frames constituting a lattice structure are also arranged in a discontinuous manner, and it is possible to obtain a semiconductor device including chip-like semiconductor elements and a rewiring layer, by dividing the dummy wafer into pieces through dicing.

In this case, a metal frame that is prepared in advance can also be placed on a support. The metal frame may be formed with a material that includes a metal and is subjected to punching by a pressing method or an etching method, for example, as in the above described mode.

Alternatively, a metal material layer may be formed on a predetermined region of the support, so that a metal frame formed with the metal material layer can be provided on the support. In this case, a metal material layer can be formed by a plating process in this step. This configuration has the advantage that metal frame miniaturization and high alignment accuracy can be achieved. Further, in a case where rewiring lines are formed by a plating process, the metal material layer forming the metal frame can also be formed by a similar plating process. Thus, process continuity can be advantageously achieved.

The semiconductor device according to the present disclosure including the above mentioned various preferred components, and the semiconductor device manufactured by the semiconductor device manufacturing method according to the present disclosure including the above mentioned various preferred components may further include some other elements such as chip-like capacitors and resistors, for example, in addition to the chip-like semiconductor elements. These other elements can be disposed in the openings of a metal frame, like the chip-like semiconductor elements.

In a metal frame, a dummy wafer, a semiconductor device, an electronic device, and a method of manufacturing a semiconductor device (hereinafter, these will be simply referred to as the present disclosure in some cases) according to the present disclosure including the above mentioned various preferred components, the shape of the openings of the metal frame is not limited to any particular shape, as long as the present disclosure can be embodied without problem. For example, there may be openings of two different shapes, or openings of three or more different shapes.

The materials forming the sealing layer used in the present disclosure and the insulating layer that will be described later are not limited to any particular materials, as long as the present disclosure can be embodied without problem. For example, a thermosetting resin or a resin that is cured when exposed to ultraviolet light can be used, and examples of such resins include epoxy resin, polyimide resin, acrylic resin, and the like. Note that the resin may contain an insulating filler.

An adhesive layer described later can be formed with an adhesive film having an adhesive applied onto a base member, like a dicing tape. Alternatively, the adhesive layer may be formed by performing coating with an adhesive by a printing method such as a spin coating method, a spray coating method, or a printing method. A material that can lower the adhesive force at the time of detachment is used as the adhesive layer so that the dummy wafer can be detached without problem as described later. Examples of adhesives include adhesives whose adhesive force decreases due to foaming caused by heating, and adhesives whose adhesive force decreases due to foaming caused by ultraviolet light emission.

The conductive material forming the rewiring lines is not limited to any particular material, and a general conductive material such as aluminum can be used. Note that, in a case where solder balls to be connected to the rewiring lines are formed, under bump metals having excellent wettability are preferably formed at the portions to be connected to the solder balls.

The shape of the dummy wafer is not limited to any particular shape. For example, the dummy wafer may be in the form of a disk or a rectangular plate. However, in a case where a dicing facility compatible with a disk-like semiconductor wafer is to be used, the dummy wafer preferably has a disk-like shape.

Various conditions specified in this specification are satisfied not only in a case where the requirements are strictly satisfied but also in a case where the requirements are substantially satisfied. The existence of variations caused by design or manufacturing is permitted. Further, the respective drawings used in the following description are schematic, and do not indicate actual dimensions and the proportions thereof.

First Embodiment

A first embodiment relates to a metal frame, a dummy wafer, a semiconductor device, and a method of manufacturing the semiconductor device according to the first mode of the present disclosure.

Figure 2:
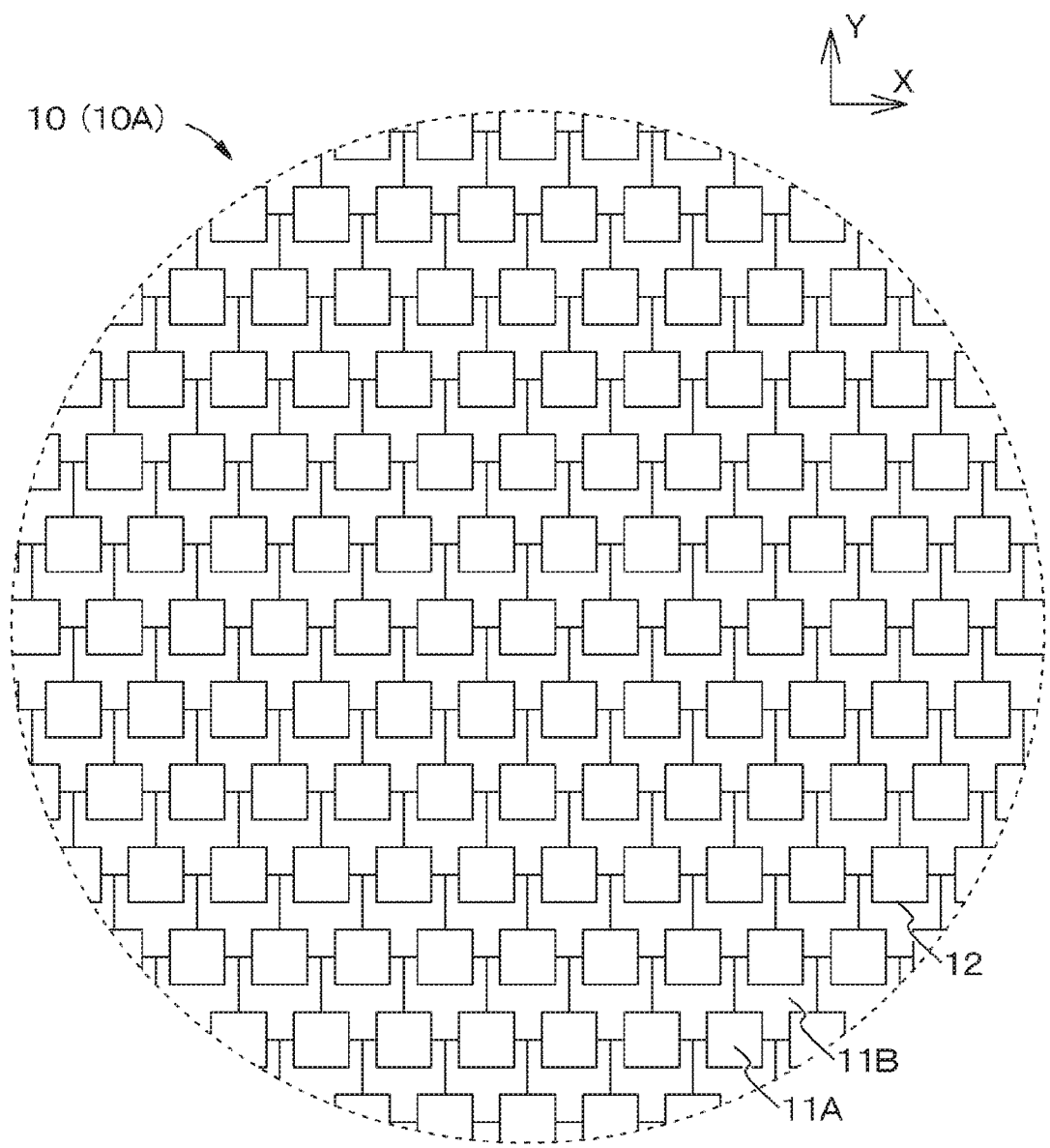
FIG. 2 is a schematic plan view showing the structure of the metal frame used in the dummy wafer shown in FIG. 1.

FIG. 1 is a schematic perspective view of a dummy wafer according to the first embodiment. FIG. 2 is a schematic plan view showing the structure of the metal frame used in the dummy wafer shown in FIG. 1.

Note that, for ease of illustration and explanation, in FIG. 1, part of a rewiring layer 8 is cut out, and the layout of the openings of a metal frame 10 and chip-like semiconductor elements 3 is shown in an exaggerated manner. The dummy wafer 100 is in the form of a disk of about 300 millimeters in diameter, for example. Note that the shape of the dummy wafer is not necessarily a disk-like shape.

The dummy wafer 100 according to the first embodiment is a dummy wafer in which the chip-like semiconductor elements 3 and the rewiring layer 8 are integrated. The dummy wafer 100 includes the metal frame 10 that has a plurality of openings in which the chip-like semiconductor elements 3 are disposed, and has a lattice structure formed with frames that are the portions between the adjacent openings. The chip-like semiconductor elements 3 and the metal frame 10 are sealed with a sealing layer 4. The sealing layer 4 will be described later in detail with reference to FIGS. 9A, 9B, 10A, 10B, 11A, 11B, 12A, and 12B and others.

FIG. 2 is a schematic plan view showing the structure of the metal frame used in the dummy wafer shown in FIG. 1.

In the metal frame 10 (also denoted by reference numeral 10A in some cases), a plurality of openings 11A and 11B are formed. A lattice structure is then formed with frames 12 that are the portions between the adjacent openings. The planar shape of the openings 11A is rectangular. The planar shape of the openings 11B is basically a rectangular shape that is larger than the openings 11A, but some portions (the portions overlapping with the openings 11A) are missing.

The metal frame 10 includes a material having high ductility. For example, the metal frame 10 can be formed with copper, a copper alloy, or an iron alloy. The thickness of the metal frame 10 is approximately 130 micrometers. Meanwhile, the width of the frames 12 is approximately 150 micrometers. However, the thickness and the width are not limited to the above.

The metal frame can be formed with a material that includes a metal and is subjected to punching by a pressing method or an etching method. Alternatively, the metal frame may be formed with a metal material layer formed at the portions corresponding to the frames by a plating process.

Figure 3:
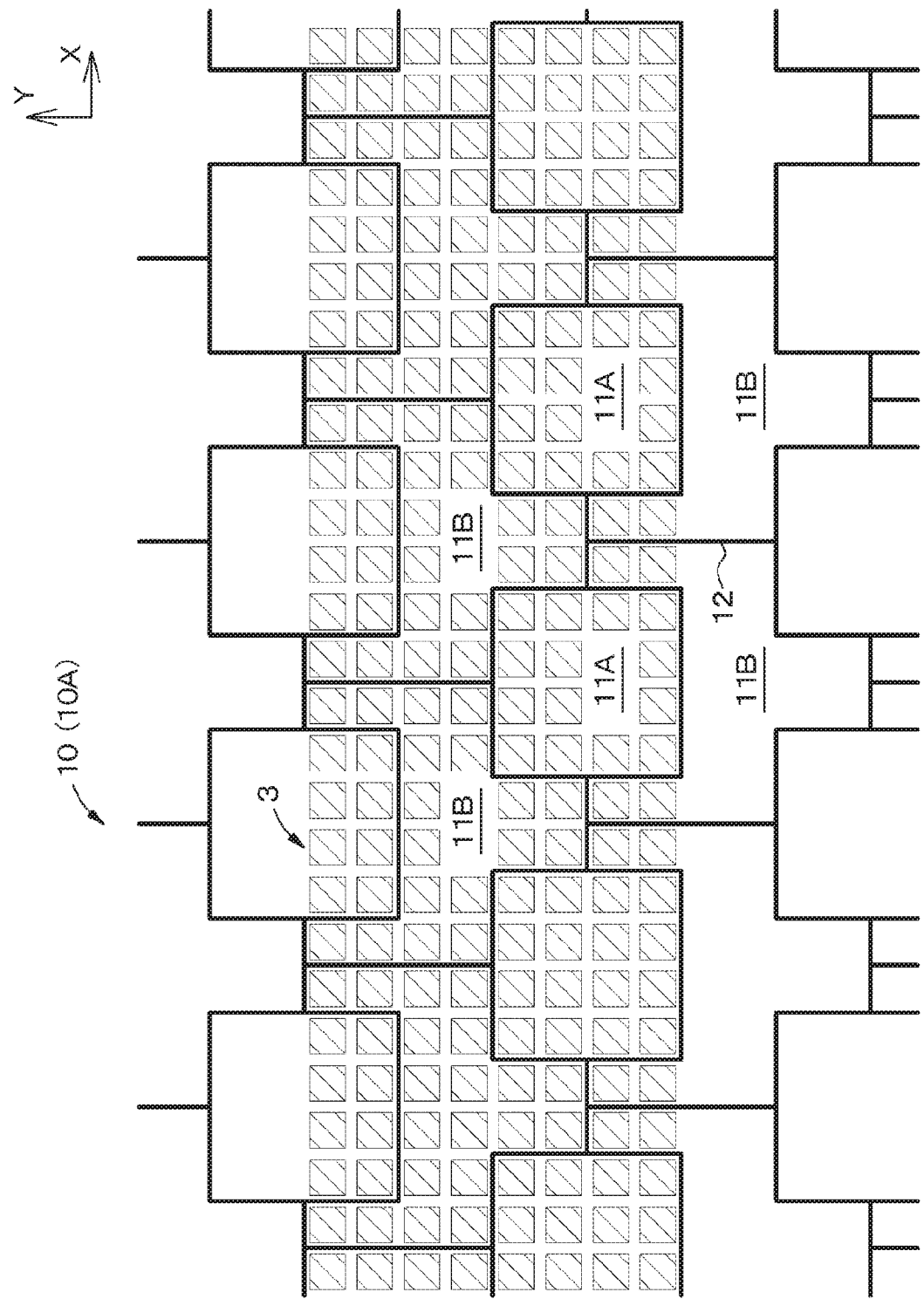
FIG. 3 is a schematic plan view for explaining the positional relationship between the metal frame and the chip-like semiconductor elements shown in FIG. 2.

FIG. 3 is a schematic plan view for explaining the positional relationship between the metal frame and the chip-like semiconductor elements shown in FIG. 2.

Note that, for ease of illustration, FIG. 3 shows an array of eight rows of chip-like semiconductor elements 3, but does not show some portions.

In the example shown in FIG. 3, 4×4 chip-like semiconductor elements 3 are disposed in each opening 11A, and twenty chip-like semiconductor elements 3 are disposed in each opening 11B. The chip-like semiconductor elements 3 are arranged in a matrix form in the row direction (the X-direction in the drawing) and in the column direction (the Y-direction in the drawing) at predetermined intervals in the entire structure.

As will be described later in detail with reference to FIGS. 16A and 16B, the frames located in the dicing area of the dummy wafer 100 among the frames forming the lattice structure are arranged in a discontinuous manner. Therefore, frames in the metal frame are not to be continuously cut over the entire dicing length, and accordingly, abrasion of the dicing blade, heat generation, and the like are reduced. Furthermore, detachment and damage of the dicing tape due to heat generation are also reduced. As a result, decrease in yield in the dicing can also be reduced.

Note that the metal frame may have various kinds of lattice structures. A modification of the metal frame is now described with reference to drawings.

Figure 4:
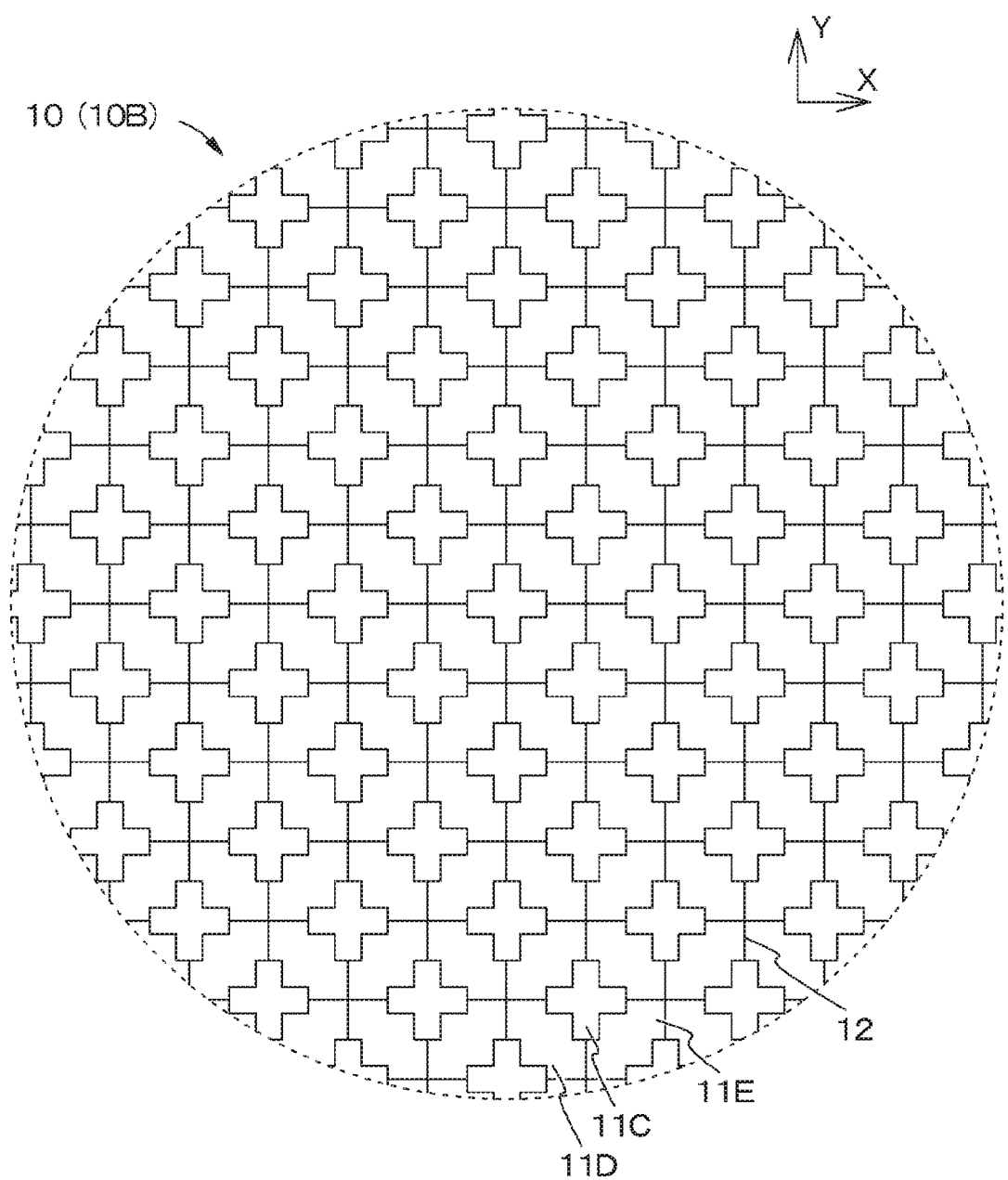
FIG. 4 is a schematic plan view of another example structure of the metal frame to be used in a dummy wafer.

FIG. 4 is a plan view of another example structure of the metal frame used in the dummy wafer.

In this metal frame 10 (also denoted by reference numeral 10B in some cases), a plurality of openings 11C, 11D, and 11E are formed. A lattice structure is then formed with frames 12 that are the portions between the adjacent openings. The planar shape of the openings 11C is a cross shape. The planar shape of the openings 11D and 11E are basically a rectangular shape, but some portions (the portions overlapping with the openings 11C) are missing. Specifically, the shape of the openings 11D is basically a rectangular shape without the upper right corner and the lower left corner, and the shape of the openings 11E is basically a rectangular shape without the upper left corner and the lower right corner.

Figure 5:
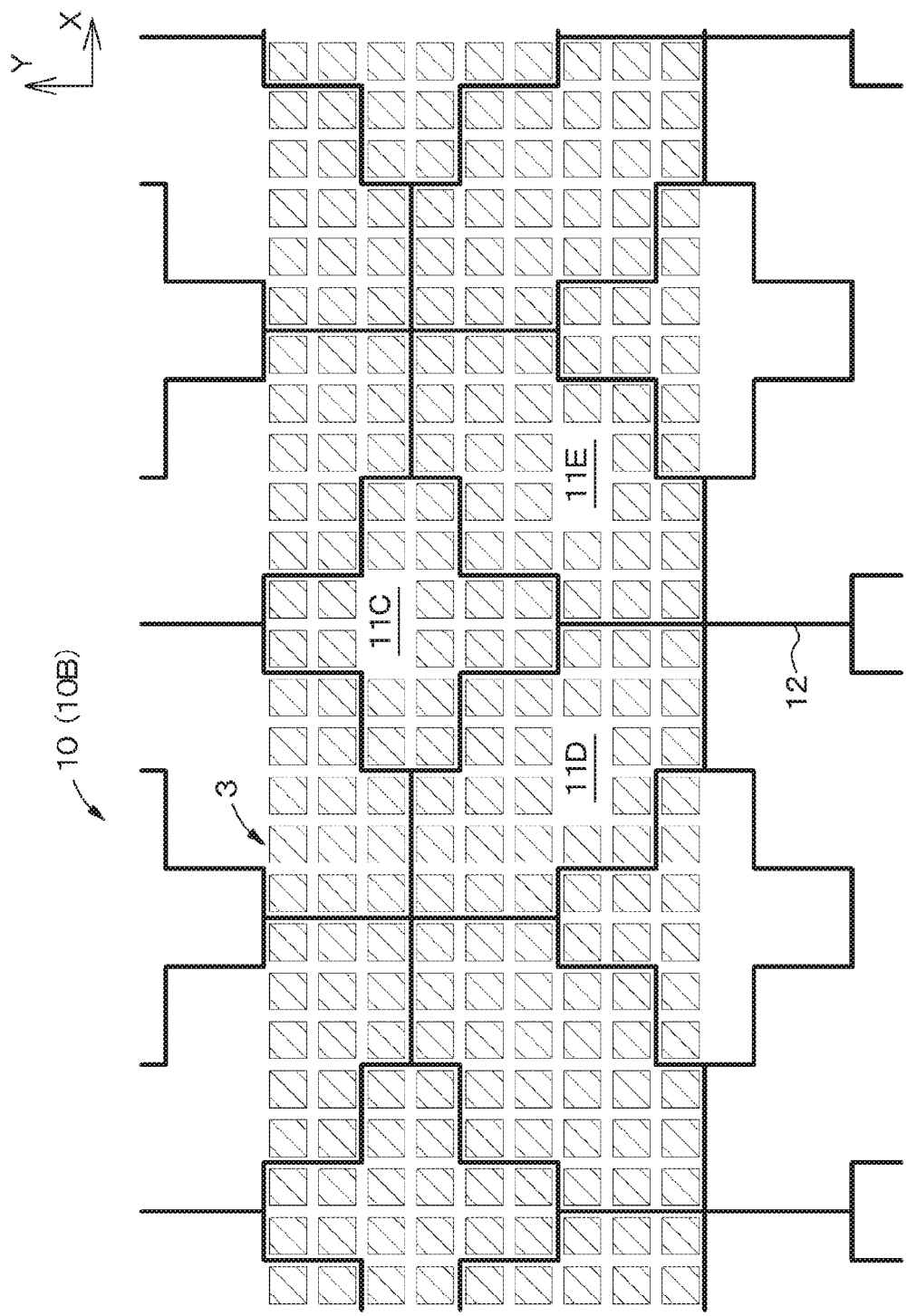
FIG. 5 is a schematic plan view for explaining the positional relationship between the metal frame and the chip-like semiconductor elements shown in FIG. 4.

FIG. 5 is a schematic plan view for explaining the positional relationship between the metal frame and the chip-like semiconductor elements shown in FIG. 4.

Note that, for ease of illustration, FIG. 5 shows an array of nine rows of chip-like semiconductor elements 3, but does not show some portions.

In the example shown in FIG. 5, twenty chip-like semiconductor elements 3 are disposed in each opening 11C, and twenty-six chip-like semiconductor elements 3 are disposed in each of the openings 11D and 11E. The chip-like semiconductor elements 3 are arranged in a matrix form in the row direction (the X-direction in the drawing) and in the column direction (the Y-direction in the drawing) at predetermined intervals in the entire structure.

A method of manufacturing a semiconductor device according to the first mode of the present disclosure is now described.

The method of manufacturing a semiconductor device according to the first embodiment includes the step of completing a dummy wafer in which chip-like semiconductor elements and a rewiring layer are integrated, the step of completing the dummy wafer including:

disposing a metal frame and the chip-like semiconductor elements on a support, the metal frame having a lattice structure formed with frames, a plurality of openings being formed in the metal frame, the frames being portions between adjacent openings of the plurality of openings, the chip-like semiconductor elements being disposed in the openings;

forming a sealing layer on the entire surface of the support, including the metal frame and the chip-like semiconductor elements;

detaching the sealing layer in which the metal frame and the chip-like semiconductor elements are sealed from the support; and forming the rewiring layer on the release surface side of the sealing layer.

Figure 6:
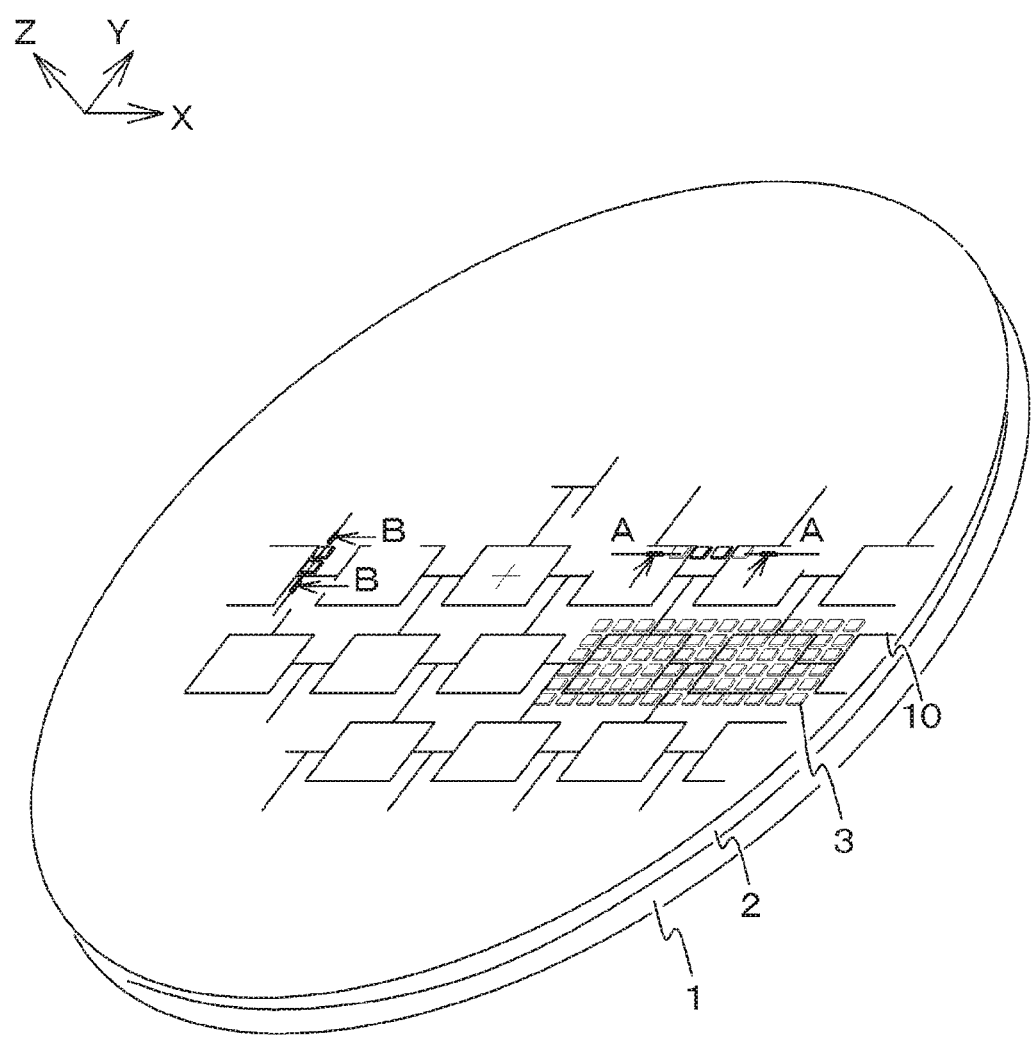
FIG. 6 is a diagram for explaining a method of manufacturing a semiconductor device according to the first embodiment, and is a schematic perspective view for explaining the positional relationship of a metal frame and chip-like semiconductor elements disposed on a support.

FIG. 6 is a diagram for explaining the method of manufacturing a semiconductor device according to the first embodiment, and is a schematic perspective view for explaining the positional relationship of the metal frame and the chip-like semiconductor elements disposed on the support.

Note that, for ease of illustration and explanation, in FIG. 6, the layout of the openings of the metal frame 10 and the chip-like semiconductor elements 3 is shown in an exaggerated manner.

According to this manufacturing method, an adhesive layer 2 is formed on a support 1, and the metal frame 10 and the chip-like semiconductor element 3 are disposed on the adhesive layer 2. Note that each chip-like semiconductor element 3 is disposed so that the surface side on which the electrode to be connected to a wiring line of the rewiring layer 8 is provided faces the adhesive layer 2. After that, formation of the sealing layer 4, detachment, formation of the rewiring layer, and the like are performed.

First, referring to FIGS. 7A, 7B, 7C, 8A, 8B, 8C, 9A, 9B, 10A, 10B, 11A, 11B, 12A, and 12B, the steps of forming and detaching the sealing layer including the metal frame and the chip-like semiconductor elements are described. Explanation is made below basically with reference to cross-sectional views (A-A cross-sectional views) of the portion defined by A-A in FIG. 6 and cross-sectional views (B-B cross-sectional views) of the portion defined by B-B in FIG. 6. Note that FIGS. 7A, 7B, 7C, 9A, 9B, 11A, and 11B are A-A cross-sectional views, and FIGS. 8A, 8B, 8C, 10A, 10B, 12A, and 12B are B-B cross-sectional views.

Figure 7A:
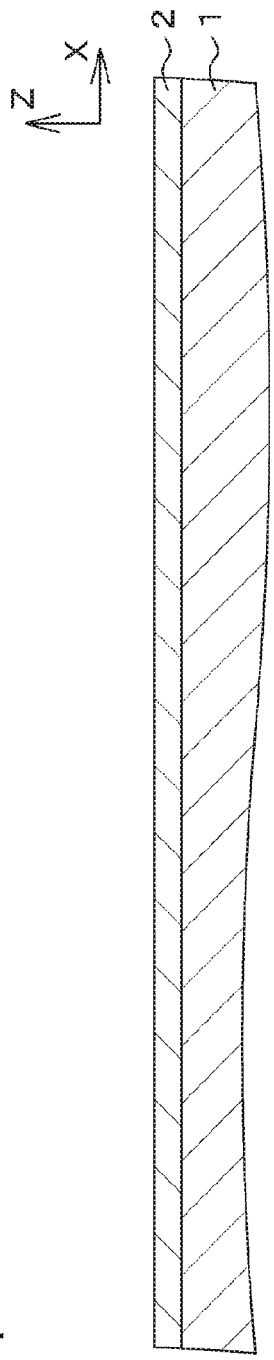
FIGS. 7A, 7B, and 7C are schematic partial cross-sectional diagrams for explaining steps of manufacturing a semiconductor device.
Figure 8A:
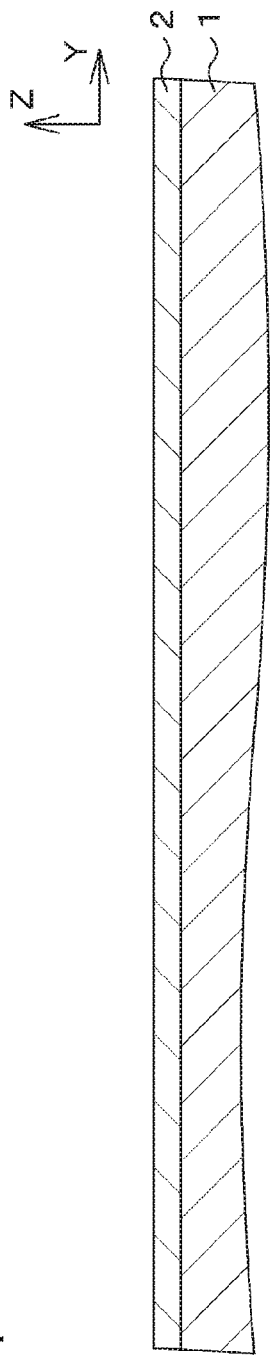
FIGS. 8A, 8B, and 8C are diagrams corresponding to FIGS. 7A, 7B, and 7C, and are schematic partial cross-sectional diagrams of a portion cut long a different cutting plane.

[Step 100] (See FIGS. 7A and 8A)

The support 1 is prepared, and the adhesive layer 2 is formed thereon. The planar shape of the support 1 is basically similar to the shape of the dummy wafer 100, and is in the form of a having a diameter of about 300 millimeters, for example. A metal substrate, a glass substrate, a semiconductor substrate, a ceramic substrate, or the like can be used as the support 1. In this example, the support 1 includes a material that transmits ultraviolet light.

The adhesive layer 2 is formed with a dicing sheet provided with an adhesive on a predetermined base material, for example. Note that various kinds of adhesives may be applied onto the support 1, to form the adhesive layer 2. A material capable of lowering its adhesive force afterwards is used for the adhesive layer 2. In this example, the adhesive layer 2 is formed with a material whose adhesive force is lowered when exposed to ultraviolet light.

[Step 110] (See FIGS. 7B and 7C, and FIGS. 8B and 8C)

The metal frame that has a plurality of openings in which the chip-like semiconductor elements 3 are to be disposed, and has a lattice structure formed with frames that are the portions between the adjacent openings, and the chip-like semiconductor elements 3 are disposed on the support 1 (more specifically, on the adhesive layer 2).

Figure 7B:
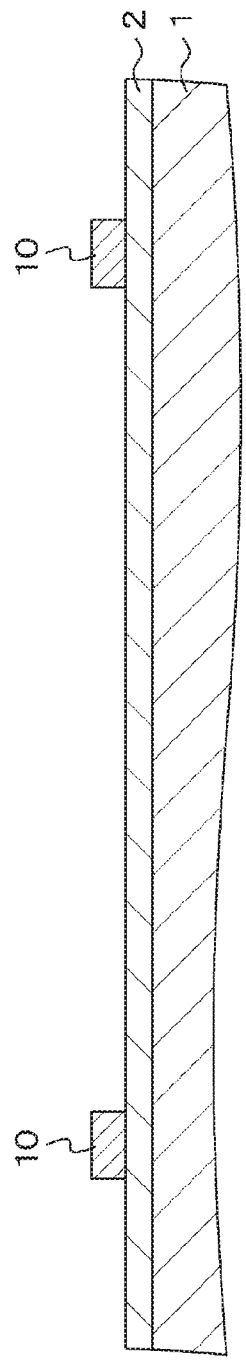
Figure 7C:
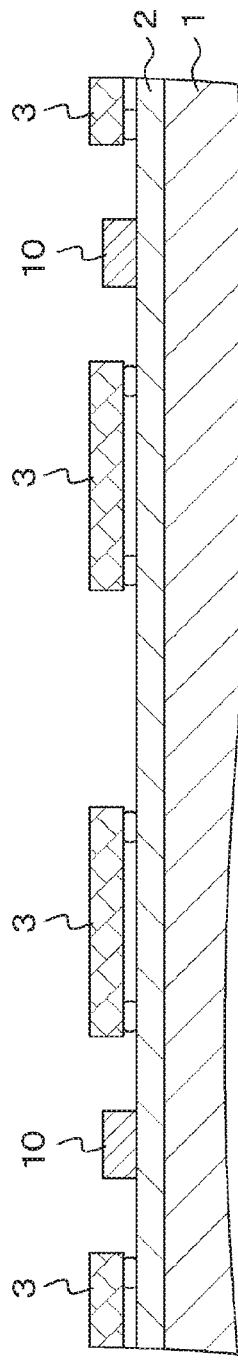
Figure 8B:
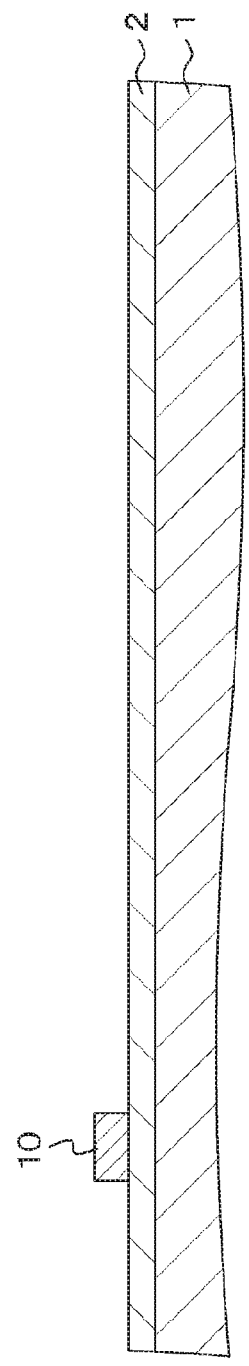
Figure 8C:
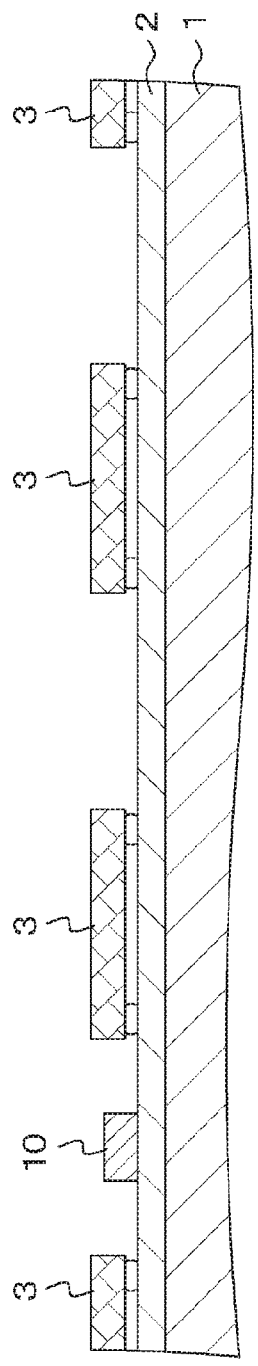
Figure 9A:
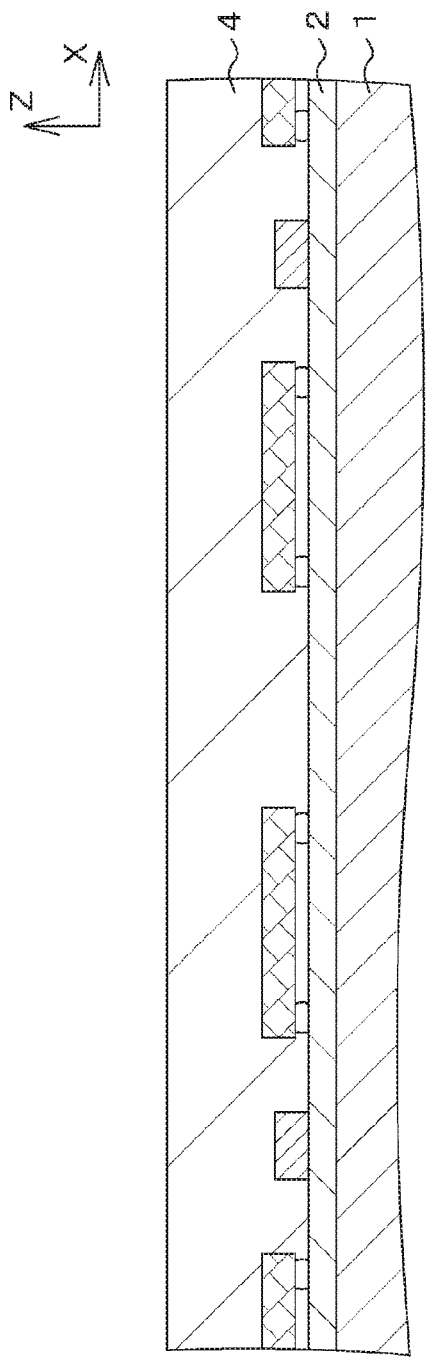
FIGS. 9A and 9B are schematic partial cross-sectional diagrams for explaining steps of manufacturing a semiconductor device, continued from FIG. 7C.
Figure 9B:
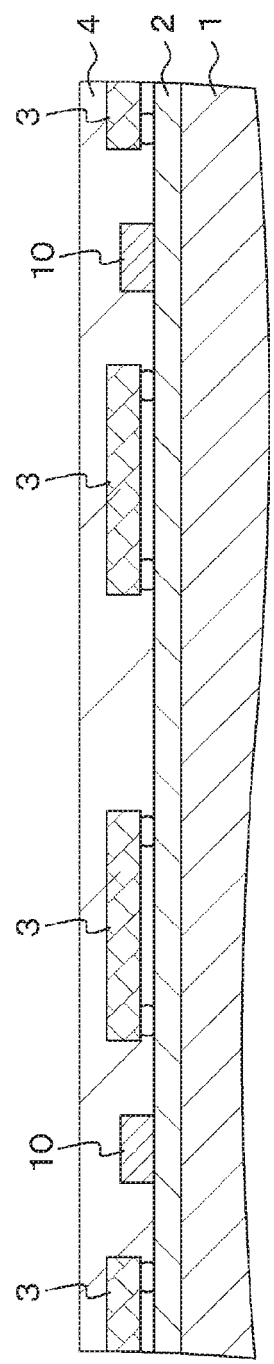

First, the metal frame 10 is placed on the adhesive layer 2 (see FIGS. 7B and 8B). For example, a metal frame that is prepared in advance may be sucked by a suction head and be positioned. After that, the metal frame may be placed on the adhesive layer 2, and be pressed with a roller subjected to fluorine processing or the like. The chip-like semiconductor elements 3 are then disposed on the adhesive layer 2 in the openings of the metal frame (see FIGS. 7C and 8C). Specifically, the electrode surface of each chip-like semiconductor element 3 is positioned to face the adhesive layer 2.

Note that the metal frame 10 may be provided after the chip-like semiconductor elements 3 are arranged. Alternatively, in some cases, a metal material layer may be formed on a predetermined region by a plating process, for example, so that a metal frame formed with the metal material layer can be provided on the support 1.

[Step 120] (See FIGS. 9A and 9B, and FIGS. 10A and 10B)

Next, the sealing layer is provided on the entire surface of the support including the metal frame and the chip-like semiconductor elements.

Specifically, a resin material is supplied onto the entire surface, and is then molded, to form the sealing layer 4. For example, a thermosetting resin material is applied, and is then cured (see FIGS. 9A and 10A). Polishing is then performed, to planarize and thin the sealing layer 4 (see FIGS. 9B and 10B).

Note that the polishing step can be skipped in a case where the required accuracy can be achieved through pressure molding or the like of the sealing layer 4, for example.

[Step 130] (See FIGS. 11A and 11B, and FIGS. 12A and 12B)

After that, the sealing layer in which the metal frame and the chip-like semiconductor elements are sealed is detached from the support.

First, a process of lowering the adhesive force is performed on the adhesive layer 2. Specifically, a process of emitting ultraviolet light from the side of the support 1 is performed (see FIGS. 11A and 12A). The sealing layer 4 in which the metal frame and the chip-like semiconductor elements 3 are sealed is then detached from the support 1 (see FIGS. 11B and 12B). The sealing layer 4 in which the metal frame and the chip-like semiconductor elements 3 are sealed forms the dummy wafer 100 prior to the formation of the rewiring layer 8.

Next, the step of providing the rewiring layer 8 on the release surface side of the sealing layer 4, and further, the step of dicing the dummy wafer 100 are described.

Figure 13:
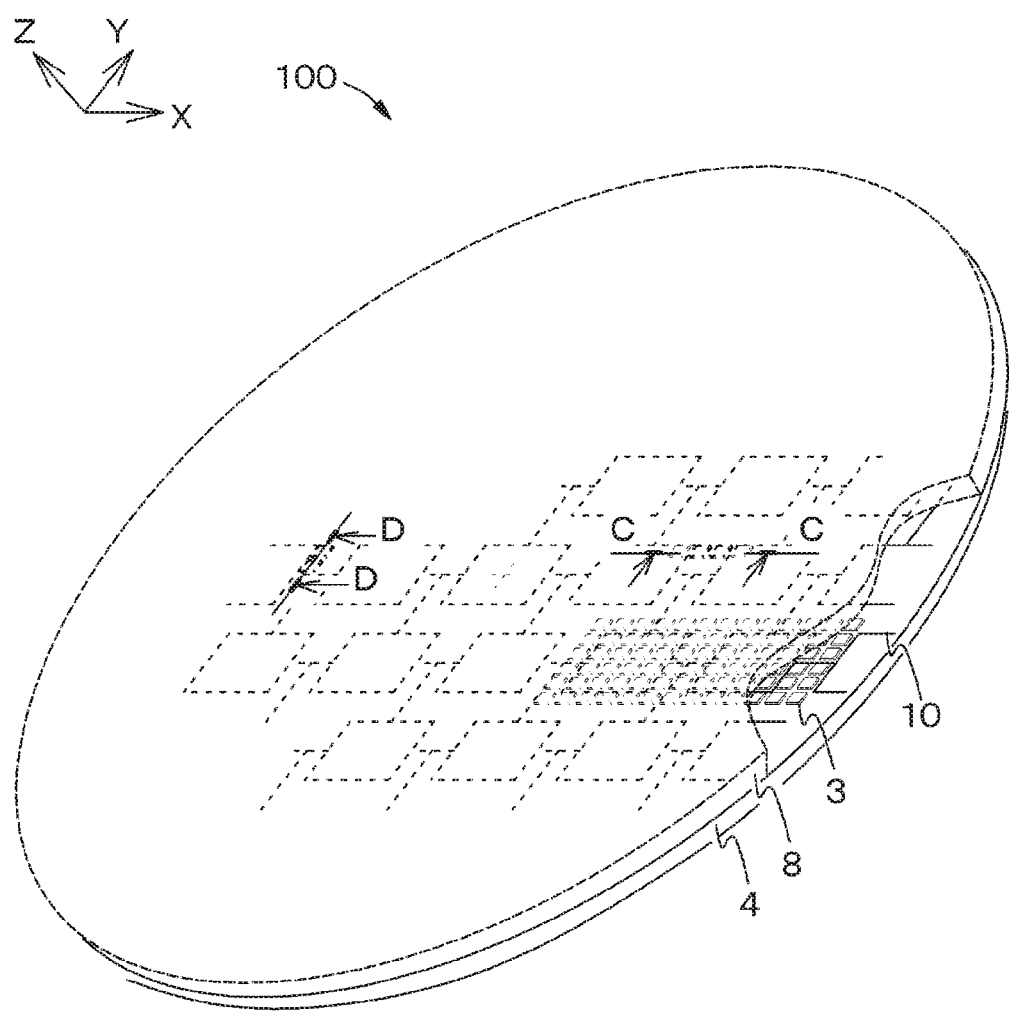
FIG. 13 is a diagram for explaining the dummy wafer detached from the support through the step shown in FIG. 11B, and is a schematic perspective view of the dummy wafer.

FIG. 13 is a diagram for explaining the dummy wafer detached from the support through the step shown in FIG. 11B, and is a schematic perspective view of the dummy wafer. Note that, for ease of explanation, the rewiring layer 8 formed by a process that will be described later is indicated by a dashed line.

Note that, for ease of illustration and explanation, in FIG. 13, part of the rewiring layer 8 is cut out, and the layout of the openings of the metal frame 10 and the chip-like semiconductor elements 3 is shown in an exaggerated manner.

Figure 14A:
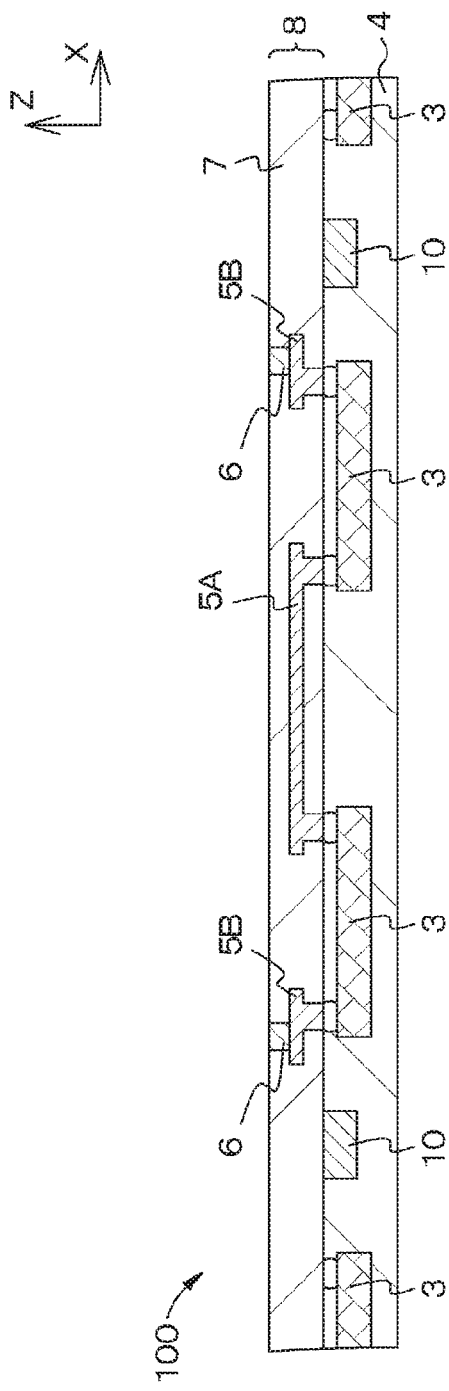
FIGS. 14A and 14B are schematic partial cross-sectional diagrams for explaining steps of manufacturing a semiconductor device, continued from FIG. 11B.
Figure 14B:
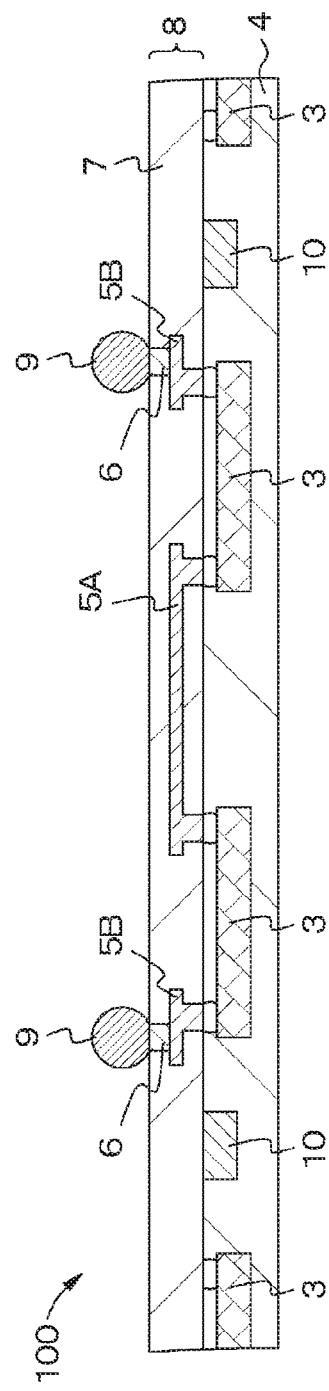
Figure 15A:
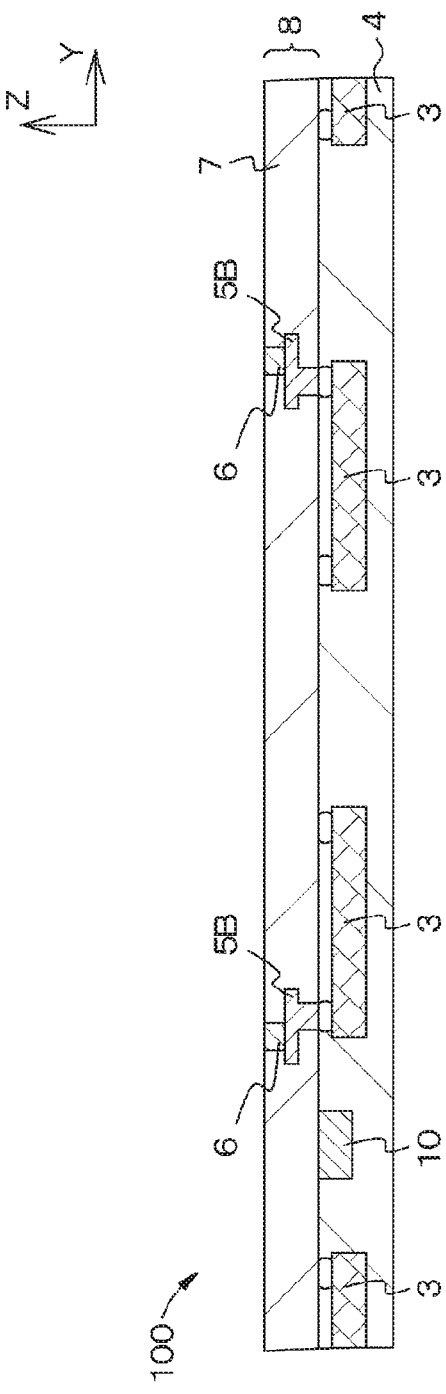
FIGS. 15A and 15B are diagrams corresponding to FIGS. 14A and 14B, and are schematic partial cross-sectional diagrams of a portion cut long a different cutting plane.
Figure 15B:
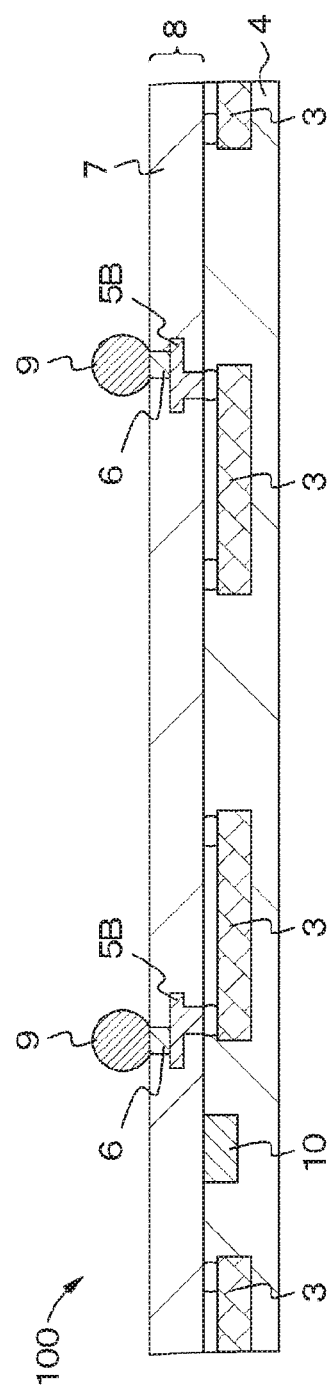

First, referring to FIGS. 14A, 14B, 15A, and 15B, the step of forming the rewiring layer 8 on the release surface side of the sealing layer 4 is described. Explanation is made below basically with reference to cross-sectional views (C-C cross-sectional views) of the portion defined by C-C in FIG. 13 and cross-sectional views (D-D cross-sectional views) of the portion defined by D-D in FIG. 13. Note that FIGS. 14A and 14B is the C-C cross-sectional views, and FIGS. 15A and 15B is the D-D cross-sectional views.

[Step 140] (See FIGS. 14A and 14B, and FIGS. 15A and 15B)

After a treatment such as cleaning is performed on the release surface of the sealing layer 4 as necessary, the rewiring layer 8 is formed on the release surface side of the sealing layer 4 (see FIGS. 14A and 14B).

For example, the rewiring layer 8 is formed on the release surface of the sealing layer 4 by a conventional semi-additive method that includes a series of steps such as formation of an insulating layer 7, formation of connection vias by exposure and development, formation of a seed layer by sputtering, and a patterning and plating process.

Reference numeral 5A indicates wiring lines that connect the semiconductor elements, and reference numeral 5B indicates wiring lines (connection vias) connected to the electrodes of the chip-like semiconductor elements 3. Reference numeral 6 indicates under bump metals formed on the wiring lines 5B. The wiring lines 5A and 5B include a conductive material such as copper, copper alloy, or aluminum, for example.

Bumps 9 such as solder balls to be connected to the wiring lines 5B are then formed over the entire structure (see FIG. 14B and FIG. 15B).

Through the above steps, the dummy wafer 100 in which the chip-like semiconductor elements 3 and the rewiring layer 8 are integrated can be obtained.

Next, dicing of the dummy wafer 100 is described.

Figure 16A:
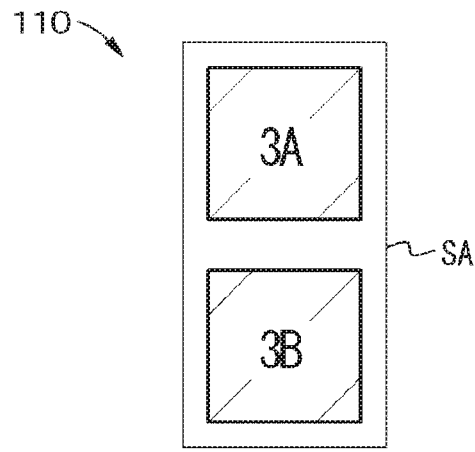
FIG. 16A is a schematic plan view of a semiconductor device obtained by dividing the dummy wafer by dicing.

FIG. 16A is a schematic plan view of a semiconductor device obtained by dividing the dummy wafer by dicing. FIG. 16B is a schematic plan view for explaining the relationship between the metal frame and the regions to be subjected to dicing.

The semiconductor device 110 shown in FIG. 16A includes two chip-like semiconductor elements 3 (3A and 3B). This semiconductor device 110 can be obtained by dicing the dummy wafer 100 as shown in FIG. 16B, for example. Symbol DGL indicates dicing areas, and symbol SA indicates singulated regions.

Figure 16B:
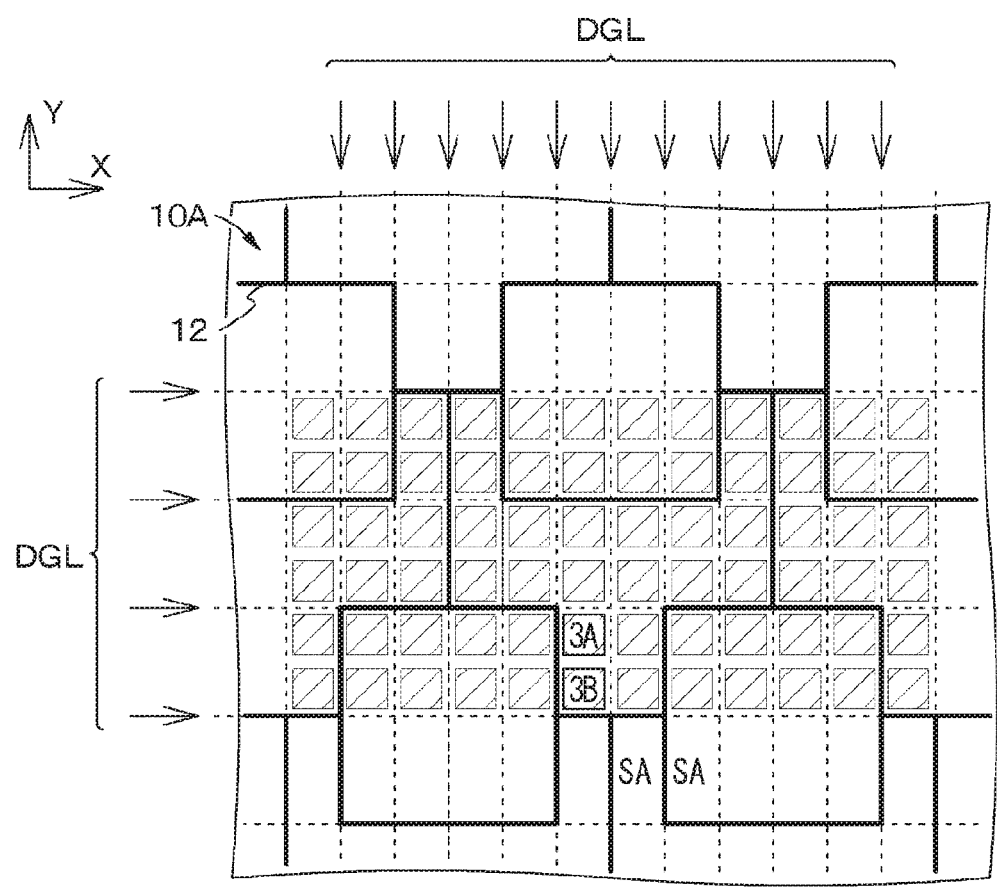
FIG. 16B is a schematic plan view for explaining the relationship between the metal frame and the regions to be subjected to dicing.

As shown in FIG. 16B, among the frames constituting the lattice structure of the metal frame 10, the frames arranged in the dicing areas of the dummy wafer 100 are arranged in a discontinuous manner. Further, the metal frame 10 has openings of such a shape that is filled with one or a plurality of singulated regions SA of the dummy wafer 100.

Referring now to FIGS. 17A and 17B, the step of dicing the dummy wafer 100 is described. These drawings are cross-sectional views (D-D cross-sectional views) of the portion defined by D-D in FIG. 13. Note that, to facilitate understanding, in FIG. 17A, a portion of the metal frame 10 that is located at the position corresponding to a dicing area and does not appear in the D-D cross-section is shown by a thin dashed line.

[Step 150] (See FIGS. 17A and 17B)

The dummy wafer 100 is attached to a dicing table with a dicing tape 20 (FIG. 17A). Note that the dicing table is not shown in the drawings.

Next, dicing is performed on the dicing areas DGL shown in FIG. 16B, to divide the dummy wafer 100 (FIG. 17B). In FIG. 17B, symbol DG denotes a dicing blade. As shown in FIG. 16B, the metal frame 10 has openings of such a shape that is filled with one or a plurality of singulated regions SA of the dummy wafer 100. Thus, all of the metal frame 10 is cut away by dicing.

The method of manufacturing a semiconductor device according to the first mode of the present disclosure has been described. A metal frame of a reference example and the problems that will arise in a case where the metal frame of the reference example is used are now described to facilitate understanding of the present disclosure.

Figure 18:
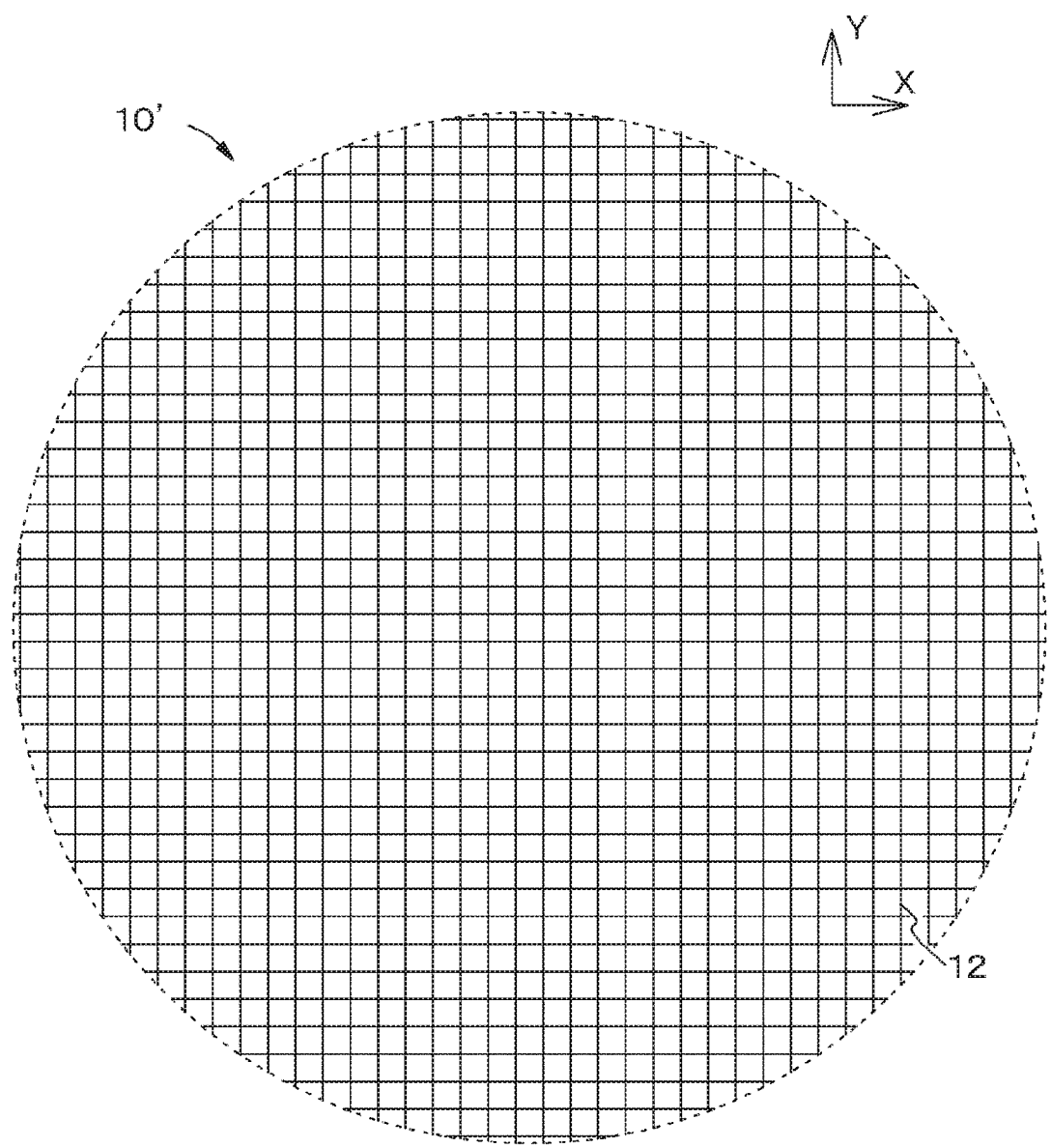
FIG. 18 is a plan view of the structure of a metal frame of a reference example.
Figure 19:
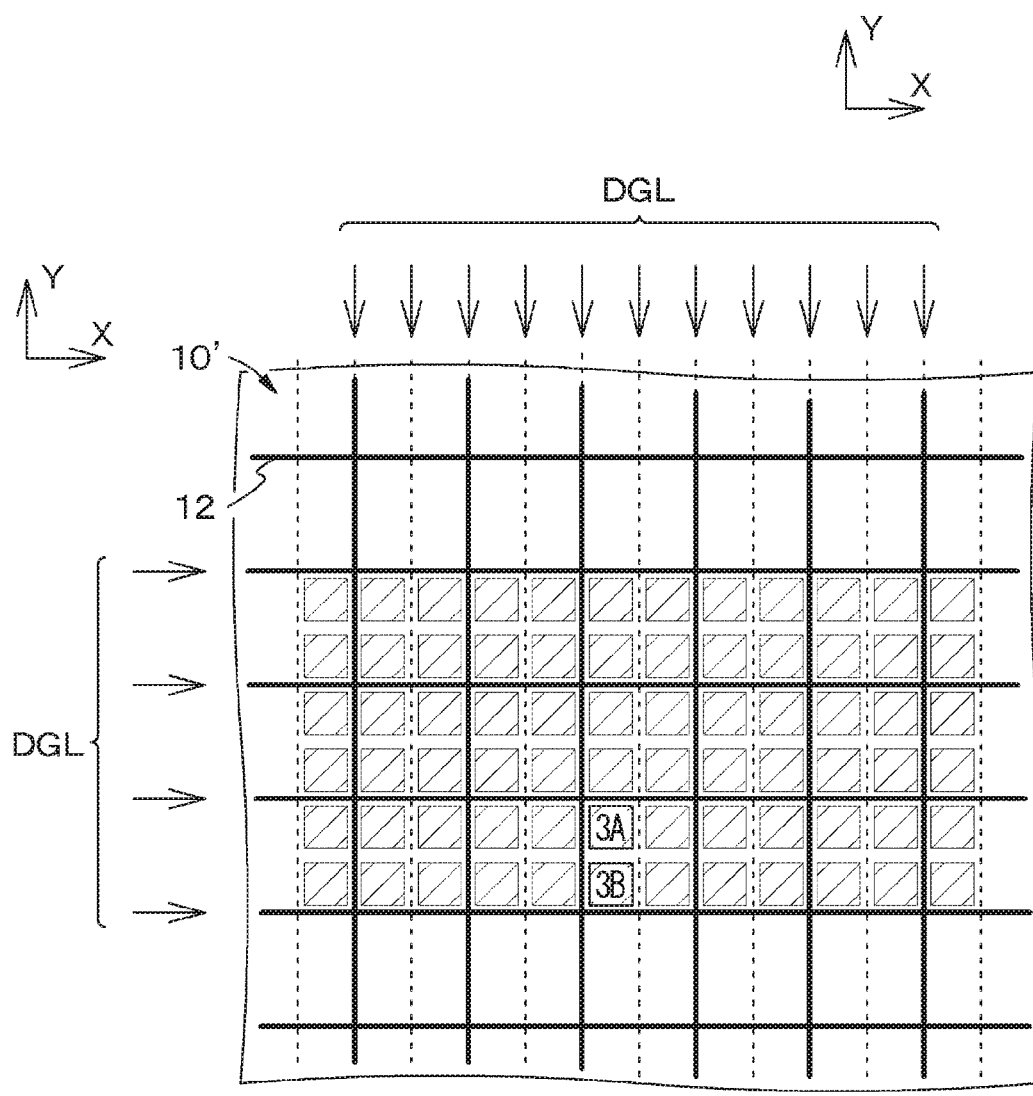
FIG. 19 is a schematic plan view for explaining the relationship between the metal frame of the reference example and the regions to be subjected to dicing.

FIG. 18 is a plan view of the structure of the metal frame of the reference example. FIG. 19 is a schematic plan view for explaining the relationship between the metal frame of the reference example and the regions to be subjected to dicing.

As shown in FIGS. 18 and 19, the metal frame 10' of the reference example has a structure in which openings are arranged in a continuous manner. In each of the openings, 2×2 chip-like semiconductor elements 3 are disposed. If the dummy wafer 100 is produced and diced by the same process as described above in this case, the frames located in the dicing areas DGL are continuously cut along the entire dicing length. Therefore, abnormal wear and damage of the dicing blade are caused. Furthermore, due to the heat generated during the cutting, metal pieces stretched at a high temperature comes in contact with the dicing sheet, and damages the dicing sheet, leading to deterioration of the external form quality or the like of the semiconductor devices formed through singulation.

In the first embodiment, on the other hand, the frames located in the dicing areas DGL are not continuously cut along the entire dicing length, as described above with reference to FIG. 16B. Accordingly, abrasion of the dicing blade, heat generation, and the like are smaller than those with the reference example. Furthermore, detachment and damage of the dicing tape due to heat generation are also reduced. As a result, decrease in yield in the dicing can also be reduced.

Second Embodiment

A second embodiment also relates to a metal frame, a dummy wafer, a semiconductor device, and a method of manufacturing the semiconductor device according to the first mode of the present disclosure.

In the first embodiment, the metal frame has openings of such a shape that is filled with one or a plurality of singulated regions of the dummy wafer. On the other hand, the second embodiment differs from the first embodiment in that the metal frame includes openings having such a shape that is not filled with one or a plurality of singulated regions of the dummy wafer.

Figure 20:
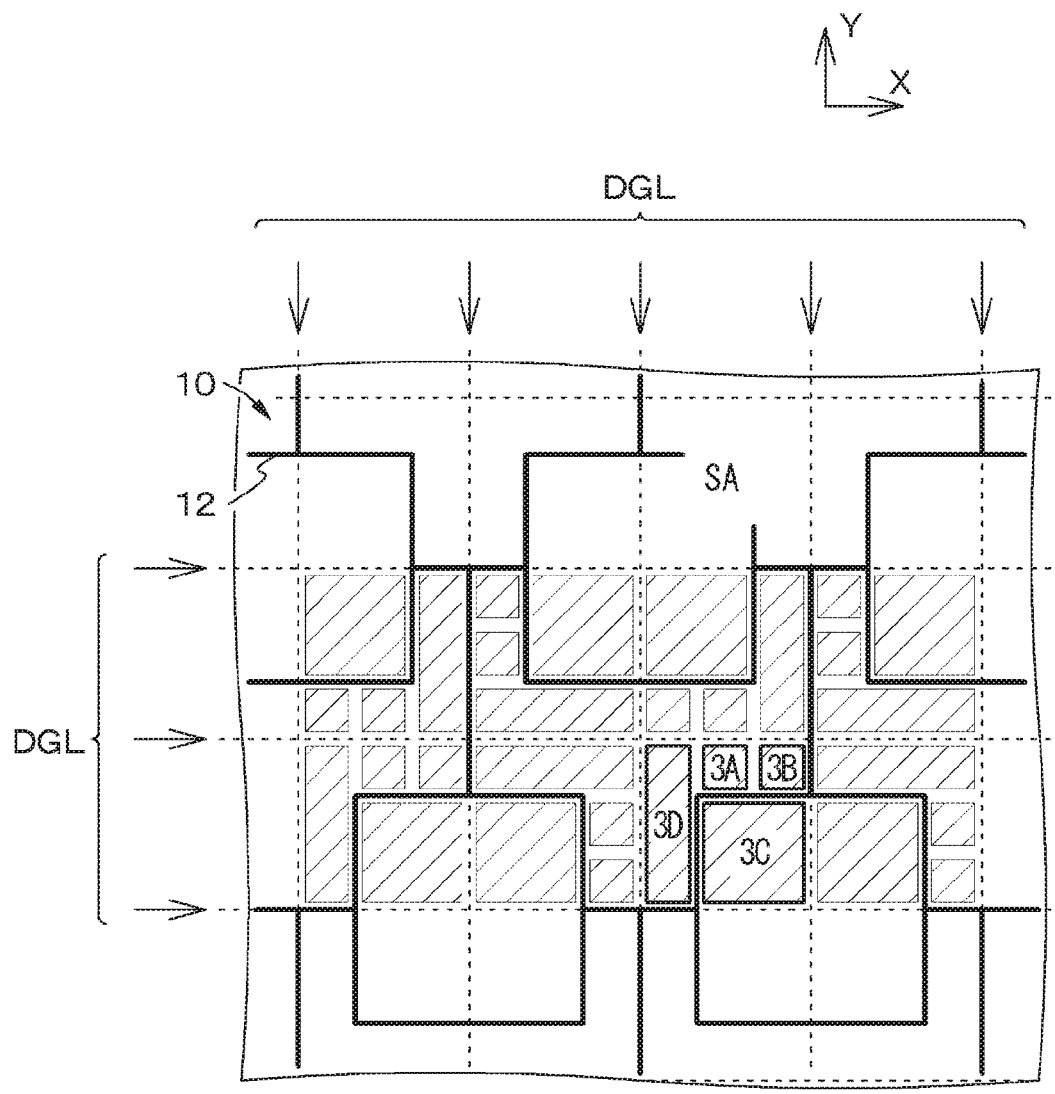
FIG. 20 is a diagram of a second embodiment, and is a schematic plan view for explaining the relationship between a metal frame and the regions to be subjected to dicing in a case where opening of the metal frame are not filled with one or a plurality of singulated regions of a dummy wafer.

FIG. 20 is a diagram of the second embodiment, and is a schematic plan view for explaining the relationship between the metal frame and the regions to be subjected to dicing in a case where opening of the metal frame are not filled with one or a plurality of singulated regions of the dummy wafer.

FIG. 20 shows an example in which each substantially rectangular region formed with a set of chip-like semiconductor elements 3A, 3B, 3C, and 3D is a singulated region SA. The other components are similar to the components described in the first embodiment, and therefore, explanation of them is not repeated herein.

Figure 21A:
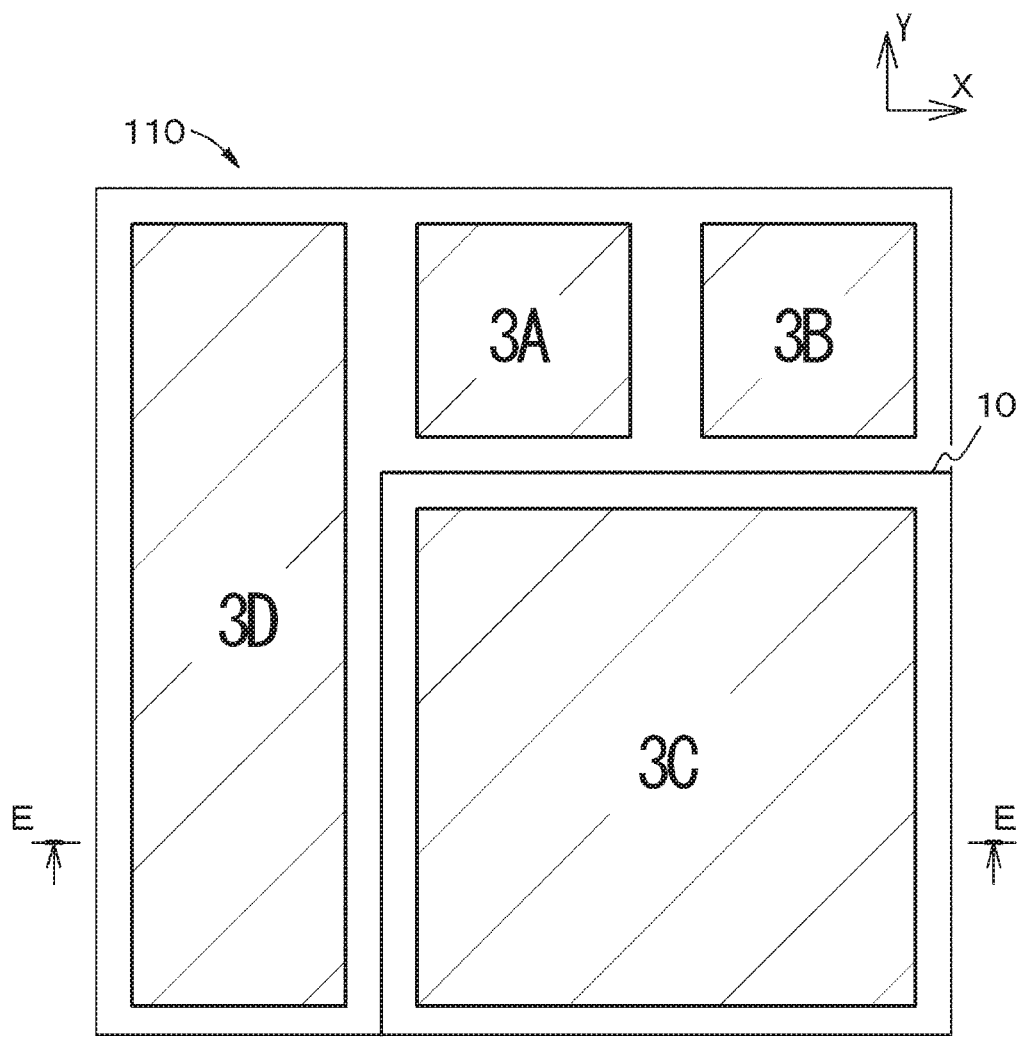
FIG. 21A is a schematic plan view of a semiconductor device obtained by the dicing shown in FIG. 20.
Figure 21B:
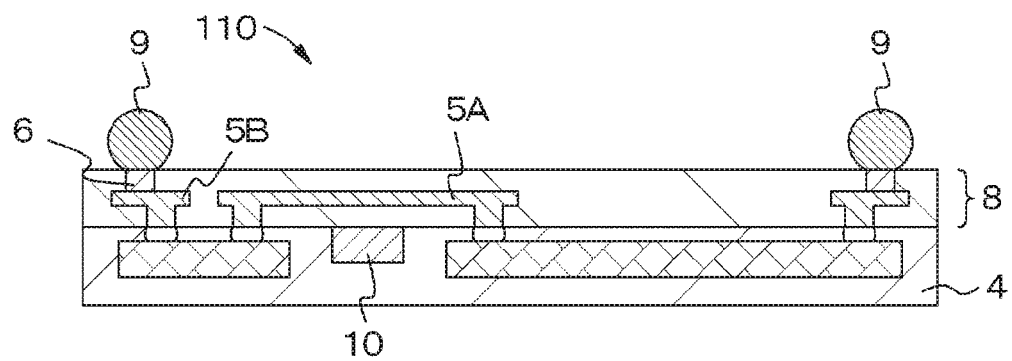
FIG. 21B is a schematic cross-sectional view of the semiconductor device.

In the configuration shown in FIG. 20, an opening of the metal frame is not filled with one or a plurality of singulated regions SA of the dummy wafer 100. Therefore, part of the frames 12 of the metal frame 10 is not subjected to dicing but remains in singulated regions SA. FIG. 21A is a schematic plan view of a semiconductor device obtained by the dicing shown in FIG. 20. FIG. 21B is a schematic cross-sectional view of the semiconductor device.

The frame 12 remaining in the singulated region SA can be used as a power supply line or a ground line. As the metal frame can be made thicker than the rewiring line, the metal frame can be used as a wiring line that has excellent electrical characteristics. Furthermore, it is possible to improve the heat release mechanism of the semiconductor device, the rigidity of the package, and the like.

Another example of the second embodiment is now described.

Figure 22:
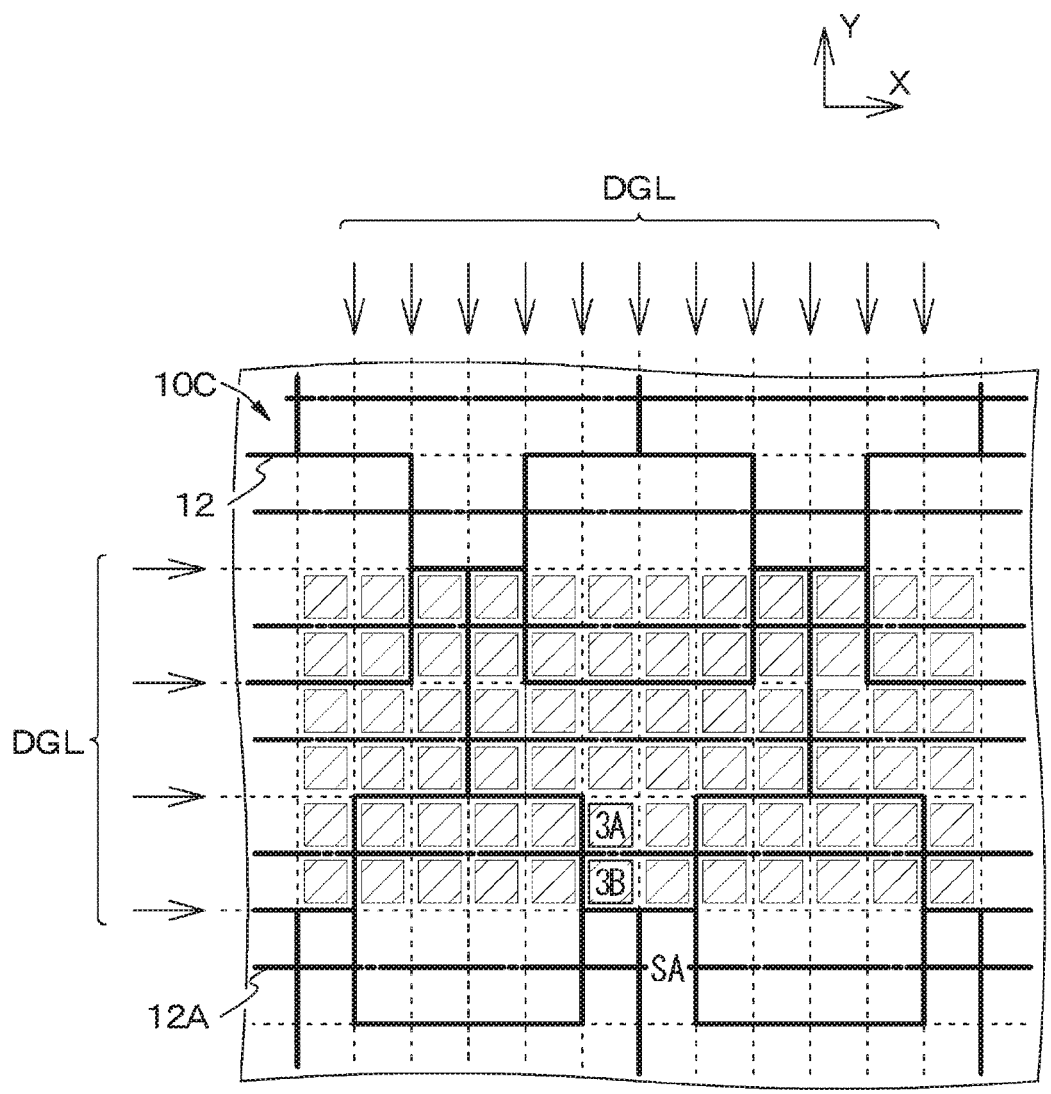
FIG. 22 shows another example of the second embodiment, and is a schematic plan view for explaining a configuration in which a metal frame includes frames that are located at positions deviating from dicing areas and extend longitudinally in singulated regions.

FIG. 22 shows another example of the second embodiment, and is a schematic plan view for explaining a configuration in which the metal frame has frames that are provided at positions deviating from the dicing areas and extend longitudinally in singulated regions.

The metal frame 10C shown in this drawing includes frames that are provided at positions deviating from the dicing areas, and extend longitudinally in singulated regions. Specifically, this structure is formed by adding frames 12A indicated by dot-and-dash lines to the metal frame 10A shown in FIG. 16B. The frames 12A are provided at positions deviating from the dicing areas, and are positioned to extend longitudinally in singulated regions SA.

Dicing similar to that described above with reference to FIG. 16B is performed, so that a semiconductor device 110 similar to the semiconductor device 110 shown in FIG. 16A can be obtained. Note that, in this case, the frames 12A remain in the singulated regions SA, and the remaining frames 12A can be used as power supply lines, ground lines, or the like.

Third Embodiment

A third embodiment relates to a metal frame, a dummy wafer, and a semiconductor device according to the first mode of the present disclosure, and further relates to a method of manufacturing a semiconductor device according to the second mode of the present disclosure.

By the manufacturing method described in the first embodiment, a dummy wafer is formed by, for example, forming a rewiring layer after mounting the chip-like semiconductor elements on a support. In the second embodiment, on the other hand, after the rewiring layer is formed on the support first, the metal frame and the chip-like semiconductor elements are arranged, and the sealing layer is formed, to complete a dummy wafer.

The configurations of the metal frame, the dummy wafer, and a semiconductor device are similar to those of the components described in the first embodiment, and therefore, explanation of them is not provided herein.

The method of manufacturing a semiconductor device according to the third embodiment includes the step of completing a dummy wafer in which chip-like semiconductor elements and a rewiring layer are integrated, the step of completing the dummy wafer including:

forming the rewiring layer on a support;

forming a metal frame on the rewiring layer, the metal frame having a lattice structure formed with frames, a plurality of openings being formed in the metal frame, the frames being portions between adjacent openings of the plurality of openings, the chip-like semiconductor elements being disposed in the openings;

disposing the chip-like semiconductor elements on the rewiring layer at the portions of the openings in the metal frame;

forming a sealing layer on the entire surface of the rewiring layer, including the metal frame and the chip-like semiconductor elements; and detaching the rewiring layer from the support.

Referring to FIGS. 23A, 23B, 23C, 24A, 24B, 25A, 25B, and 26, the method of manufacturing a semiconductor device according to the third embodiment is described below. Note that these drawings are cross-sectional views of the portion corresponding to the A-A cross-section shown in FIG. 6 and the C-C cross-section shown in FIG. 13 referred to in the first embodiment.

Figure 23A:
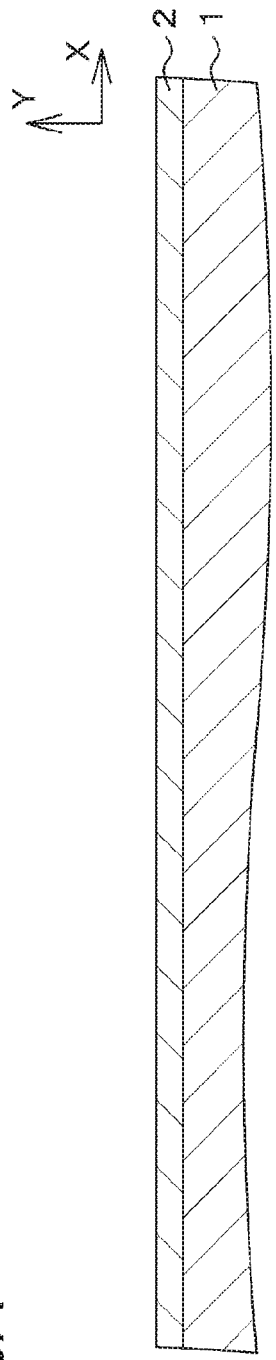
FIGS. 23A, 23B, and 23C are schematic partial cross-sectional diagrams for explaining a method of manufacturing a dummy wafer and a semiconductor device according to a third embodiment.

[Step 200] (FIG. 23A)

The support 1 is prepared, and the adhesive layer 2 is formed thereon. This step is similar to [step 100] described in the first embodiment, and therefore, explanation thereof is not made herein.

Figure 23B:
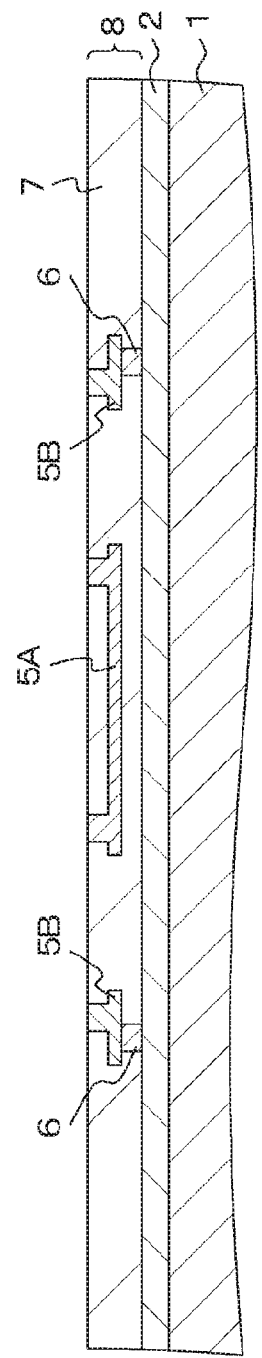

[Step 210] (See FIG. 23B)

The rewiring layer 8 is then provided on the support 1 (more specifically, on the adhesive layer 2). Although the stacking order of the wiring lines 5A and 5B constituting the rewiring layer 8, the under bump metals 6, and the like is different, the rewiring layer 8 can be formed by a conventional semi-additive method basically in a manner similar to that described in the first embodiment.

Figure 23C:
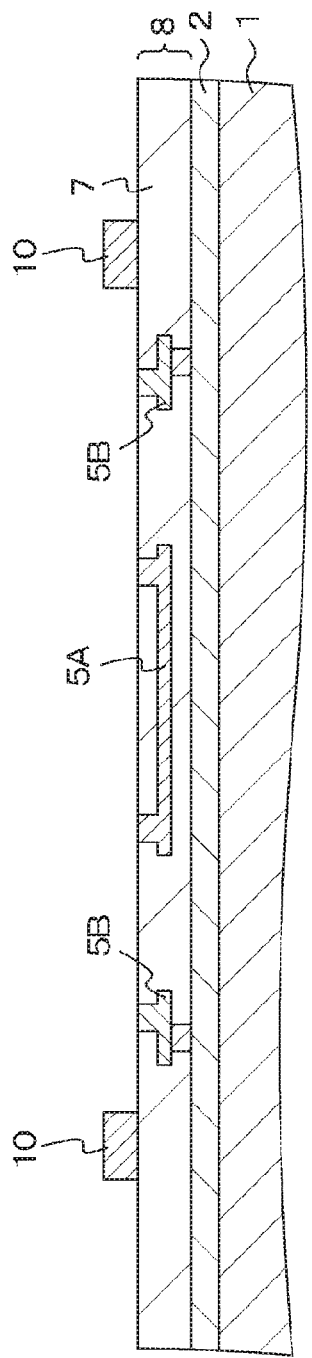

[Step 220] (See FIG. 23C)

After that, the metal frame that has a plurality of openings in which chip-like semiconductor elements are to be disposed, and has a lattice structure formed with frames that are the portions between the adjacent openings is placed on the rewiring layer 8.

First, the metal frame 10 is placed on the rewiring layer 8 (see FIG. 23C). A metal frame which is prepared in advance may be provided as in the first embodiment. However, in terms of process continuity, it is preferable to form, at the time of formation of the rewiring layer 8, a metal material layer on a predetermined region by a plating process, for example, and place a metal frame formed with the metal material layer on the rewiring layer 8.

Figure 24A:
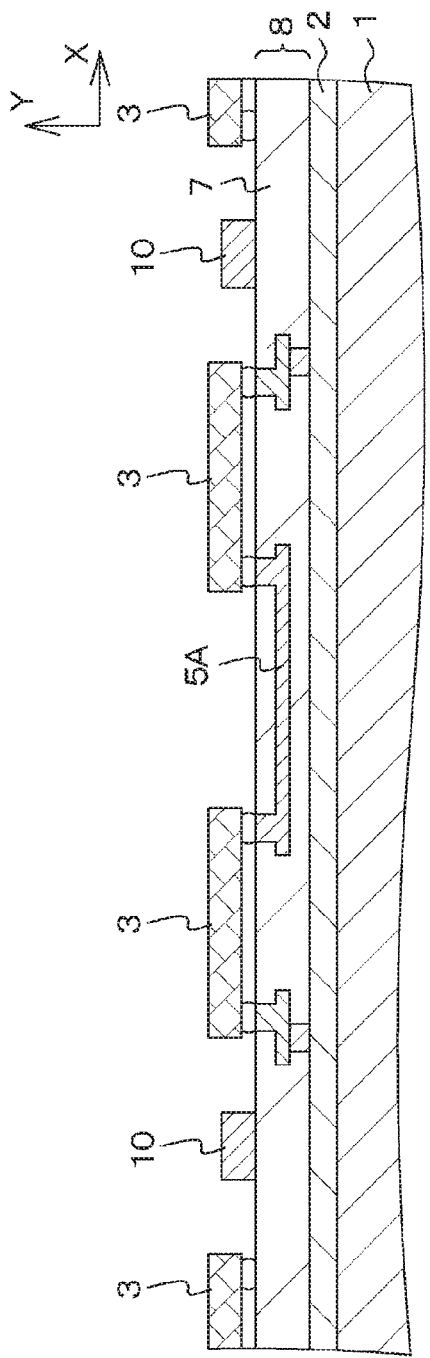
FIGS. 24A and 24B are schematic partial cross-sectional diagrams for explaining steps of manufacturing a dummy wafer and a semiconductor device, continued from FIG. 23C.

[Step 230] (See FIG. 24A)

The chip-like semiconductor elements 3 are then placed on the rewiring layer 8 in the openings of the metal frame (see FIG. 24). Bumps are formed in advance on the chip-like semiconductor elements 3. After flip-chip mounting with the electrode surface facing downward, and a reflow step and the like, the bumps are electrically and mechanically connected to the rewiring lines and the like that have already been formed.

Figure 24B:
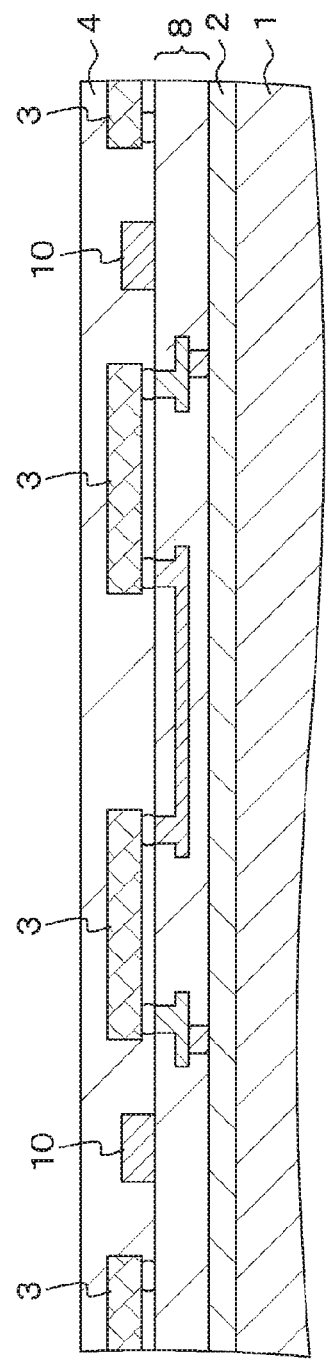

[Step 240] (See FIG. 24B)

The sealing layer 4 is then provided on the entire surface of the rewiring layer 8, including the metal frame and the chip-like semiconductor elements.

Specifically, this step is similar to [step 120] described in the first embodiment, and therefore, explanation thereof is not made herein.

Figure 25A:
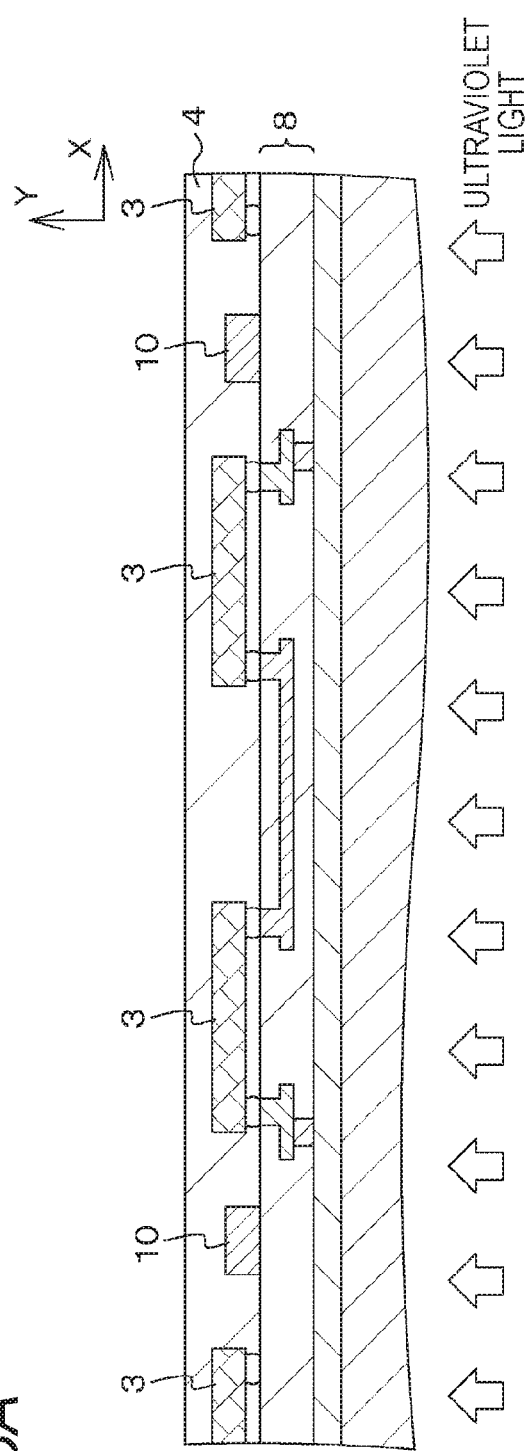
FIGS. 25A and 25B are schematic partial cross-sectional diagrams for explaining steps of manufacturing a dummy wafer and a semiconductor device, continued from FIG. 24B.
Figure 25B:
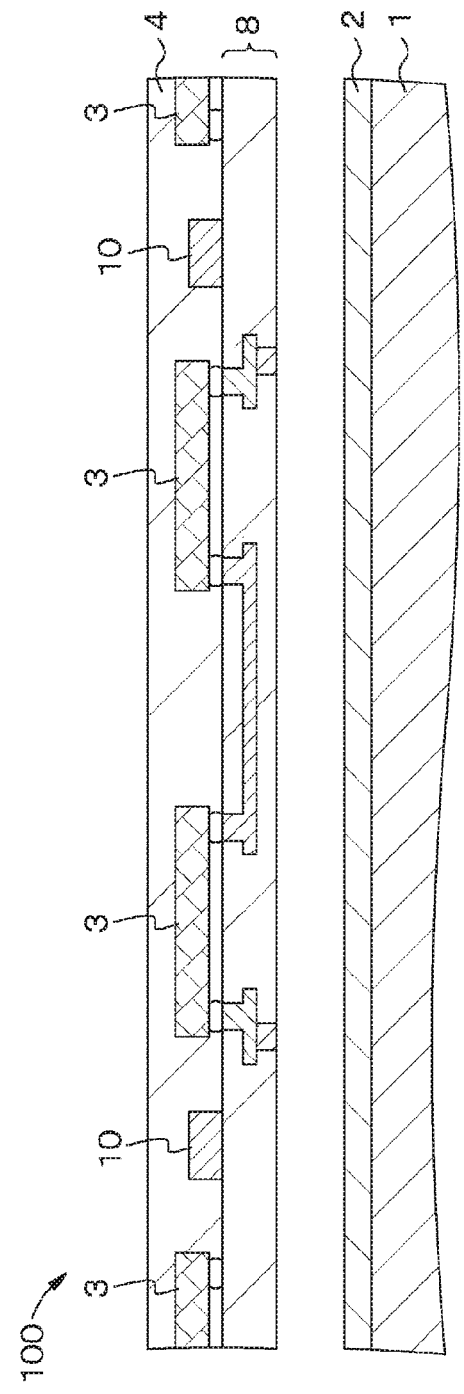

[Step 250] (See FIGS. 25A and 25B)

After that, the rewiring layer is detached from the support, to complete a dummy wafer in which the chip-like semiconductor elements and the rewiring layer are integrated.

First, a process of lowering the adhesive force is performed on the adhesive layer 2. Specifically, a process of emitting ultraviolet light from the side of the support 1 is performed (see FIG. 25A). The rewiring layer 8 is then detached from the support 1 (see FIG. 25B). The sealing layer 4 in which the metal frame and the chip-like semiconductor elements 3 are sealed, and the rewiring layer 8 form the dummy wafer 100.

Figure 26:
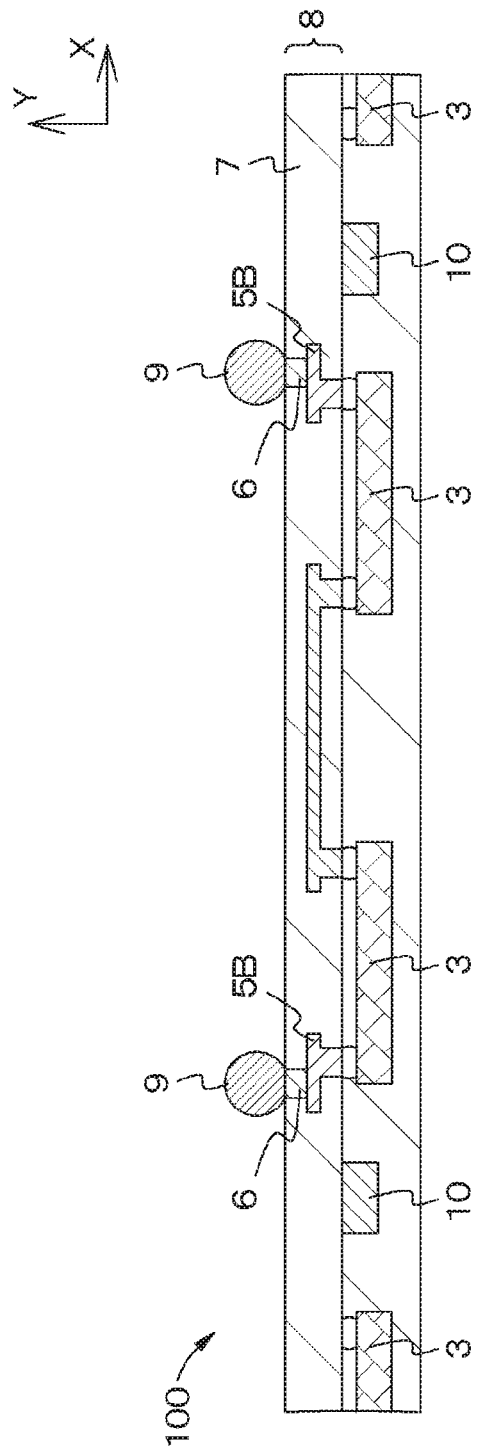
FIG. 26 is a schematic partial cross-sectional diagram for explaining a step of manufacturing a dummy wafer and a semiconductor device, continued from FIG. 25B.

[Step 260] (See FIG. 26)

After a treatment such as cleaning is performed on the release surface of the rewiring layer 8 of the dummy wafer 100 as necessary, bumps 9 such as solder balls to be connected to the wiring lines 5B are formed over the entire surface.

Through the above steps, the dummy wafer 100 in which the chip-like semiconductor elements 3 and the rewiring layer 8 are integrated can be obtained. The dicing of the dummy wafer 100 is similar to that described in the first embodiment and the second embodiment, and therefore, explanation thereof is not made herein.

Fourth Embodiment

Figure 27:
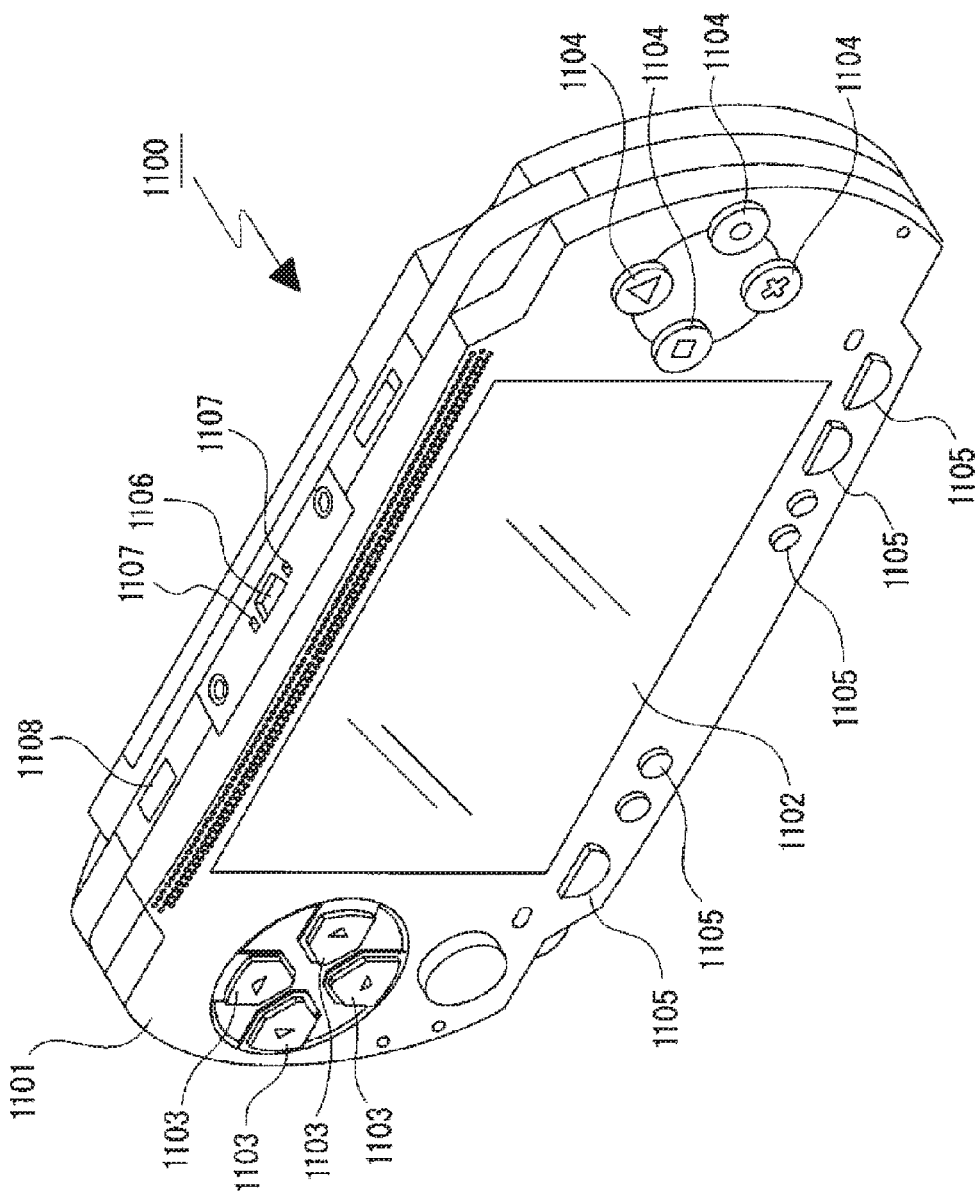
FIG. 27 is a diagram of a fourth embodiment, and is a schematic perspective view of an electronic device in which semiconductor devices of the present disclosure are used.

A fourth embodiment according to the present disclosure is an electronic device on which semiconductor devices obtained by any of the above described embodiments are mounted. FIG. 27 shows a schematic configuration of the electronic device.

For example, the electronic device 1100 is formed with necessary components disposed inside and outside an outer casing 1101 formed in a horizontally elongated flat shape, and is to be used as a game device, for example.

On the front surface of the outer casing 1101, a display panel 1102 is provided in the center in the horizontal direction. Four operation keys 1103 and four operations keys 1104 arranged at intervals in the circumferential direction are provided on the left and right sides of the display panel 1102, respectively. Four operation keys 1105 are further provided at lower end portions of the front surface of the outer casing 1101. The operation keys 1103, the operation keys 1104, and the operation keys 1105 function as direction keys and decision keys to be used for selection of a menu item displayed on the display panel 1102, progress of a game, and the like.

A connecting terminal 1106 for connecting to an external device, a supply terminal 1107 for power supply, a light receiving window 1108 for infrared communication with an external device, and the like are provided on the upper surface of the outer casing 1101.

Next, the circuit configuration of the electronic device 1100 is described.

Figure 28:
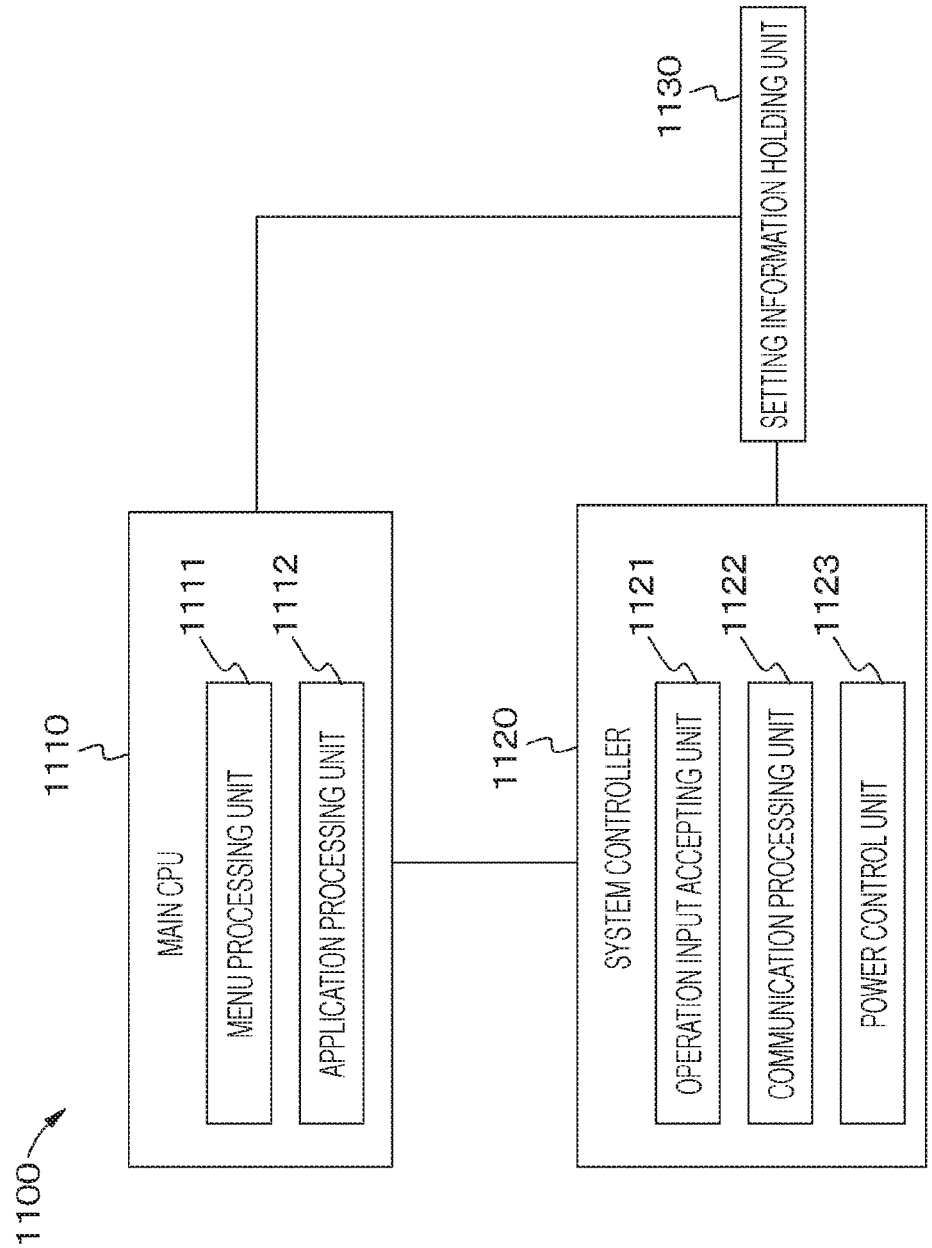
FIG. 28 is a schematic block diagram showing the circuit configuration of the electronic device shown in FIG. 27.

FIG. 28 is a schematic block diagram showing the circuit configuration of the electronic device shown in FIG. 27.

The electronic device 1100 includes a main central processing unit (CPU) 1110 and a system controller 1120. Electric power is supplied to the main CPU 1110 and the system controller 1120 from a battery (not shown) through a different system, for example. The electronic device 1100 further includes a setting information holding unit 1130 formed with a memory or the like that holds various kinds of information set by the user. The main CPU 1110, the system controller 1120, and the setting information holding unit 1130 are designed as integrated semiconductor devices according to the present disclosure.

The main CPU 1110 includes a menu processing unit 111 that generates a menu screen for allowing the user to set various kinds of information and select an application, and an application processing unit 112 that executes the application. The set information is sent to the setting information holding unit 1130 by the main CPU 1110, and held in the setting information holding unit 1130. The system controller 1120 includes an operation input accepting unit 121, a communication processing unit 122, and a power control unit 123. The operation input accepting unit 121 detects the states of the operation keys 1103, the operation keys 1104, and the operation keys 1105, the communication processing unit 122 performs a communication process with an external device, and the power control unit 123 controls the electric power to be supplied to the respective components.

[Other Aspects]

Although embodiments of the present disclosure have been specifically described so far, the present disclosure is not limited to the above embodiments, and various changes based on the technical idea of the present disclosure may be made to them. For example, the numerical values, structures, substrates, materials, processes, and the like, which have been described in the above embodiments, are merely examples, and different numerical values, structures, substrates, materials, processes, and the like from the above may be used where necessary.

Note that the technology according to the present disclosure can also be in the following forms.

[A1]
A metal frame that is used in a dummy wafer in which chip-like semiconductor elements and a rewiring layer are integrated,
a plurality of openings in which the chip-like semiconductor elements are disposed being formed, a lattice structure being formed with frames, the frames being portions between adjacent openings of the plurality of openings,
of the frames forming the lattice structure, frames located in a dicing area of the dummy wafer being arranged in a discontinuous manner.

[A2]
The metal frame according to [A1], including an opening of a shape filled with at least one singulated region of the dummy wafer.

[A3]
The metal frame according to [A1], including an opening of a shape not filled with at least one singulated region of the dummy wafer.

[A4]
The metal frame according to [A1], including a frame that is disposed at a position deviating from the dicing area, and extends longitudinally in a singulated region.

[A5]
The metal frame according to any of [A1] to [A4], in which a material forming the metal frame is one of copper, a copper alloy, and an iron alloy.

[A6]
The metal frame according to any of [A1] to [A5], in which the metal frame is formed with a material including a metal, the material being subjected to punching by a pressing method or an etching method.

[A7]
The metal frame according to any of [A1] to [A5], in which the metal frame is formed with a metal material layer formed at a portion corresponding to the frames by a plating process.

[B1]
A dummy wafer in which chip-like semiconductor elements and a rewiring layer are integrated,
the dummy wafer including
a metal frame having a plurality of openings in which the chip-like semiconductor elements are disposed, a lattice structure being formed with frames, the frames being portions between adjacent openings of the plurality of openings,
in which, of the frames forming the lattice structure, frames located in a dicing area of the dummy wafer are arranged in a discontinuous manner.

[B2]
The dummy wafer according to [B1], in which the metal frame includes an opening of a shape filled with at least one singulated region of the dummy wafer.

[B3]
The dummy wafer according to [B1], in which the metal frame includes an opening of a shape not filled with at least one singulated region of the dummy wafer.

[B4]
The dummy wafer according to [B1], in which the metal frame includes a frame that is disposed at a position deviating from the dicing area, and extends longitudinally in a singulated region.

[B5]
The dummy wafer according to any of [B1] to [B4], in which a material forming the metal frame is one of copper, a copper alloy, and an iron alloy.

[B6]
The dummy wafer according to any of [B1] to [B5], in which the metal frame is formed with a material including a metal, the material being subjected to punching by a pressing method or an etching method.

[B7]
The dummy wafer according to any of [B1] to [B5], in which the metal frame is formed with a metal material layer formed at a portion corresponding to the frames by a plating process.

[C1]
An electronic device including a semiconductor device,
the electronic device including
a semiconductor device formed by dividing a dummy wafer into pieces through dicing, chip-like semiconductor elements and a rewiring layer being integrated in the dummy wafer,
the dummy wafer including
a metal frame having a plurality of openings in which the chip-like semiconductor elements are disposed, a lattice structure being formed with frames, the frames being portions between adjacent openings of the plurality of openings,
of the frames forming the lattice structure, frames located in a dicing area of the dummy wafer being arranged in a discontinuous manner.

[C2]
The electronic device according to [C1], in which the metal frame includes an opening of a shape filled with at least one singulated region of the dummy wafer.

[C3]
The electronic device according to [C1], in which the metal frame includes an opening of a shape not filled with at least one singulated region of the dummy wafer.

[C4]
The electronic device according to [C1], in which the metal frame includes a frame that is disposed at a position deviating from the dicing area, and extends longitudinally in a singulated region.

[C5]
The electronic device according to any of [C1] to [C4], in which a material forming the metal frame is one of copper, a copper alloy, and an iron alloy.

[C6]
The electronic device according to any of [C1] to [C5], in which the metal frame is formed with a material including a metal, the material being subjected to punching by a pressing method or an etching method.

[C7]
The electronic device according to any of [C1] to [C5], in which the metal frame is formed with a metal material layer formed at a portion corresponding to the frames by a plating process.

[D1]
A method of manufacturing a semiconductor device, including
the step of completing a dummy wafer in which chip-like semiconductor elements and a rewiring layer are integrated,
the step of completing the dummy wafer including:
disposing a metal frame and the chip-like semiconductor elements on a support, the metal frame having a lattice structure formed with frames, a plurality of openings being formed in the metal frame, the frames being portions between adjacent openings of the plurality of openings, the chip-like semiconductor elements being disposed in the openings;

forming a sealing layer on an entire surface of the support, including the metal frame and the chip-like semiconductor elements;

detaching the sealing layer in which the metal frame and the chip-like semiconductor elements are sealed from the support; and forming the rewiring layer on a release surface side of the sealing layer.

[D2]

The method of manufacturing a semiconductor device according to [D1], in which of the frames forming the lattice structure, frames disposed in a dicing area of the dummy wafer are arranged in a discontinuous manner, and the dummy wafer is divided into pieces through dicing, to obtain a semiconductor device including the chip-like semiconductor elements and the rewiring layer.

[D3]

The method of manufacturing a semiconductor device according to [D1] or [D2], in which a metal frame prepared in advance is disposed on the support.

[D4]

The method of manufacturing a semiconductor device according to [D1] or [D2], in which a metal frame formed with a metal material layer is disposed on the support, the metal material layer being formed on a predetermined region of the support.

[D5]

The method of manufacturing a semiconductor device according to [D4], in which the metal material layer is formed by a plating process.

[E1]

A method of manufacturing a semiconductor device, including the step of completing a dummy wafer in which chip-like semiconductor elements and a rewiring layer are integrated, the step of completing the dummy wafer including:

forming the rewiring layer on a support;

forming a metal frame on the rewiring layer, the metal frame having a lattice structure formed with frames, a plurality of openings being formed in the metal frame, the frames being portions between adjacent openings of the plurality of openings, the chip-like semiconductor elements being disposed in the openings;

disposing the chip-like semiconductor elements on the rewiring layer at portions of the openings in the metal frame;

forming a sealing layer on an entire surface of the rewiring layer, including the metal frame and the chip-like semiconductor elements; and detaching the rewiring layer from the support.

[E2]

The method of manufacturing a semiconductor device according to [E1], in which, of the frames forming the lattice structure, frames disposed in a dicing area of the dummy wafer are arranged in a discontinuous manner, and the dummy wafer is divided into pieces through dicing, to obtain a semiconductor device including the chip-like semiconductor elements and the rewiring layer.

[E3]

The method of manufacturing a semiconductor device according to [E1] or [E2], in which a metal frame prepared in advance is disposed on the support.

[E4]

The method of manufacturing a semiconductor device according to [E1] or [E2], in which a metal frame formed with a metal material layer is disposed on the support, the metal material layer being formed on a predetermined region of the support.

[E5]

The method of manufacturing a semiconductor device according to [E4], in which the metal material layer is formed by a plating process.

REFERENCE SIGNS LIST

1 Support
2 Adhesive layer
3, 3A, 3B, 3C, 3D Chip-like semiconductor element
4 Sealing layer
5A Wiring line
5B Wiring line (connection via)
6 Under bump metal
7 Insulating layer
8 Rewiring layer
9 Bump
10, 10A, 10B, 10C, 10' Metal frame
11A, 11B, 11C
11D Opening
12, 12A Frame
20 Dicing tape
100 Dummy wafer
110 Semiconductor device
DG Dicing blade
DGL Dicing Area
SA Singulated region
1100 Electronic device
1101 Outer casing
1102 Display panel
1103 Operation key
1104 Operation key
1105 Operation key
1106 Terminal
1107 Supply terminal for power supply
1108 Light receiving window
1110 Main CPU
1111 Menu processing unit
1112 Application processing unit
1120 System controller
1121 Operation input accepting unit
1122 Communication processing unit
1123 Power control unit
1130 Setting information holding unit

The invention claimed is:

1. A metal frame, comprising:
   a plurality of openings, wherein each opening of the plurality of openings includes a plurality of chip-like semiconductor elements; and
   a lattice structure including a plurality of frames, wherein each frame of the plurality of frames is between adjacent openings of the plurality of openings,
      the plurality of frames includes a set of frames in a dicing area of a dummy wafer, and
      frames of the set of frames are in a discontinuous arrangement on a dicing length of the dicing area.

2. The metal frame according to claim 1, wherein an opening of the plurality of openings includes at least one singulated region of the dummy wafer.

3. The metal frame according to claim 1, wherein the plurality of openings includes an opening in which a singulated region of the dummy wafer is absent.

4. The metal frame according to claim 3, wherein
the plurality of frames includes a specific frame at a position that deviates from the dicing area, and
the specific frame extends longitudinally in the singulated region.

5. The metal frame according to claim 1, further comprising a material that is one of copper, a copper alloy, or an iron alloy.

6. The metal frame according to claim 1, further comprising a metal.

7. The metal frame according to claim 1, further comprising a metal material layer at a portion of the metal frame corresponding to the plurality of frames.

8. A dummy wafer, comprising:
a metal frame that includes:
a plurality of openings, wherein each opening of the plurality of openings includes a plurality of chip-like semiconductor elements; and
a lattice structure that includes a plurality of frames, wherein
each frame of the plurality of frames is between adjacent openings of the plurality of openings,
the plurality of frames includes a set of frames in a dicing area of the dummy wafer, and
frames of the set of frames are in a discontinuous arrangement on a dicing length of the dicing area; and
a rewiring layer integrated with the plurality of chip-like semiconductor elements.

9. A semiconductor device, comprising:
a specific frame of a metal frame of a dummy wafer;
at least one chip-like semiconductor element of a plurality of chip-like semiconductor elements, wherein the metal frame includes:
a plurality of openings, wherein each opening of the plurality of openings includes the plurality of chip-like semiconductor elements; and
a lattice structure that includes a plurality of frames, wherein
the plurality of frames includes the specific frame,
each frame of the plurality of frames is between adjacent openings of the plurality of openings,
the plurality of frames includes a set of frames in a dicing area of the dummy wafer, and
frames of the set of frames are in a discontinuous arrangement on a dicing length of the dicing area; and
a rewiring layer integrated with the at least one chip-like semiconductor element.

10. An electronic device, comprising:
a semiconductor device that includes:
a specific frame of a dummy wafer;
at least one chip-like semiconductor element of a plurality of chip-like semiconductor elements, wherein the dummy wafer includes:
a metal frame that includes:
a plurality of openings, wherein each opening of the plurality of openings includes the plurality of chip-like semiconductor elements; and
a lattice structure that includes a plurality of frames, wherein
the plurality of frames includes the specific frame,
each frame of the plurality of frames is between adjacent openings of the plurality of openings,
the plurality of frames includes a set of frames in a dicing area of the dummy wafer, and
frames of the set of frames are in a discontinuous arrangement on a dicing length of the dicing area; and
a rewiring layer integrated with the at least one chip-like semiconductor element.

11. A method of manufacturing a semiconductor device, comprising:
disposing a metal frame and a plurality of chip-like semiconductor elements on a support, wherein the metal frame includes:
a lattice structure including a plurality of frames; and
a plurality of openings, wherein
each frame of the plurality of frames is between adjacent openings of the plurality of openings,
the plurality of frames includes a set of frames in a dicing area of a dummy wafer,
frames of the set of frames are in a discontinuous arrangement on a dicing length of the dicing area, and
each opening of the plurality of openings includes the plurality of chip-like semiconductor elements;
forming a sealing layer on an entire surface of the support including the metal frame that is on the support and the plurality of chip-like semiconductor elements that is on the support;
detaching the sealing layer from the support; and
forming a rewiring layer on a release surface side of the sealing layer.

12. The method of manufacturing the semiconductor device according to claim 11, further comprising dicing the dummy wafer into a plurality of pieces to obtain the semiconductor device, wherein the semiconductor device includes at least one chip-like semiconductor element of the plurality of chip-like semiconductor elements and the rewiring layer.

13. The method of manufacturing the semiconductor device according to claim 11, wherein the metal frame disposed on the support includes a metal material layer.

14. The method of manufacturing the semiconductor device according to claim 13, further comprising forming the metal material layer by a plating process.

15. A method of manufacturing a semiconductor device, comprising:
forming a rewiring layer on a support;
forming a metal frame on the rewiring layer, wherein the metal frame includes:
a lattice structure including a plurality of frames; and
a plurality of openings, wherein
each frame of the plurality of frames is between adjacent openings of the plurality of openings,
the plurality of frames includes a set of frames in a dicing area of a dummy wafer, and
frames of the set of frames are in a discontinuous arrangement on a dicing length of the dicing area;
disposing a plurality of chip-like semiconductor elements on the rewiring layer in each opening of the plurality of openings in the metal frame;
forming a sealing layer on an entire surface of the rewiring layer, the metal frame that is on the rewiring layer, and the plurality of chip-like semiconductor elements that is on the rewiring layer; and
detaching the rewiring layer from the support.

16. The method of manufacturing the semiconductor device according to claim 15, further comprising dicing the dummy wafer into a plurality of pieces to obtain the semiconductor device, wherein the semiconductor device includes the plurality of chip-like semiconductor elements and the rewiring layer.

17. The method of manufacturing the semiconductor device according to claim 15, wherein the metal frame disposed on the support includes a metal material layer.

18. The method of manufacturing the semiconductor device according to claim 17, further comprising forming the metal material layer by a plating process.

* * * * *